(12) United States Patent
Webb et al.

(10) Patent No.: US 6,928,093 B2
(45) Date of Patent: Aug. 9, 2005

(54) LONG DELAY AND HIGH TIS PULSE STRETCHER

(75) Inventors: R. Kyle Webb, Escondido, CA (US); Scot T. Smith, San Diego, CA (US); Roy Luoma, Fallbrook, CA (US)

(73) Assignee: Cymer, Inc., San Diego, CA (US)

( * ) Notice: Subject to any disclaimer, the term of this patent is extended or adjusted under 35 U.S.C. 154(b) by 75 days.

(21) Appl. No.: 10/712,545

(22) Filed: Nov. 13, 2003

(65) Prior Publication Data

US 2004/0136417 A1 Jul. 15, 2004

Related U.S. Application Data

(63) Continuation-in-part of application No. 10/141,216, filed on May 7, 2002, now Pat. No. 6,693,939.

(51) Int. Cl.$^7$ .............................................. H01S 3/10
(52) U.S. Cl. .............................. 372/25; 372/61; 372/93
(58) Field of Search .............................. 372/25, 55, 58, 372/93, 92, 99, 101, 107, 61, 69

(56) References Cited

U.S. PATENT DOCUMENTS

| | | | | |
|---|---|---|---|---|
| 4,500,996 A | * | 2/1985 | Sasnett et al. | ................. 372/19 |
| 4,723,256 A | * | 2/1988 | Hoag | ........................... 372/93 |
| 4,757,511 A | * | 7/1988 | Klingel et al. | ................. 372/58 |

(Continued)

*Primary Examiner*—Minsun Oh Harvey
*Assistant Examiner*—Tuan N. Nguyen
(74) *Attorney, Agent, or Firm*—William C. Cray; Cymer, Inc.

(57) ABSTRACT

A method and apparatus for laser light pulse stretching is disclosed which may comprise a beam splitter in the path of a laser output light pulse beam; selected to pass a first percent of the energy of a first input pulse of the laser output light pulse beam along a laser output light pulse beam output path as a first output pulse and to reflect a second percent of the energy of the laser output light pulse beam into a first delayed beam; an optical delay path receiving the first delayed beam and returning the first delayed beam to the beam splitter in an orientation such that a third percent of the first delayed beam is reflected into the output path as a second output pulse and a fourth percent is passed into the optical delay path as a second delayed beam; the optical delay path receiving the second delayed beam and returning the second delayed beam to the beam splitter in an orientation such that the third percent of the second delayed beam is reflected into the output path as a third output pulse and the fourth percent of the second delayed beam is passed into the optical delay path as a third delayed beam; the optical delay path receiving the third delayed beam and returning the third delayed beam to the beam splitter in an orientation such that the third percent of the third delayed beam is reflected into the output path as a fourth output pulse; the first input pulse being a first pulse in a plurality of pulses output from a prior pulse stretcher, each of a plurality of succeeding input pulses comprising the output of the prior pulse stretcher resulting from the stretching of a narrow band laser light output pulse, forming successive first, second, third and fourth output pulses, the combination of which forms a pulse stretcher having an output with TIS of at least 200 ns. The optical delay path may be formed of a plurality of at least eight reflecting mirrors and contained in an elongated enclosure having first and second end plates mounting a first group of at least four of the at least eight reflecting mirrors mounted on the first mounting surface symmetrically about a center axis of the optical delay path and a second group of at least four of the at least eight reflecting mirrors mounted on the second mounting surface symmetrically about the center axis. The mirrors may be staggered in a predefined pattern, e.g., a circular pattern. The delay path may lie in a plurality of planes. The apparatus may be part of a laser system, part of a beam delivery system or an interface between the two.

52 Claims, 21 Drawing Sheets

U.S. PATENT DOCUMENTS

| | | | |
|---|---|---|---|
| 5,023,884 A | 6/1991 | Akins et al. | 372/57 |
| 5,025,445 A | 6/1991 | Anderson et al. | 372/20 |
| 5,025,446 A | 6/1991 | Kuizenga | 372/21 |
| 5,113,408 A * | 5/1992 | Bihler | 372/93 |
| 5,189,678 A | 2/1993 | Ball et al. | 372/28 |
| 5,313,481 A | 5/1994 | Cook et al. | 372/37 |
| 5,315,611 A | 5/1994 | Ball et al. | 372/56 |
| 5,359,620 A | 10/1994 | Akins | 372/58 |
| 5,448,580 A | 9/1995 | Birx et al. | 372/38 |
| 5,471,965 A | 12/1995 | Kapich | 123/565 |
| 5,852,621 A | 12/1998 | Sandstrom | 372/25 |
| 5,863,017 A | 1/1999 | Larson et al. | 248/176.1 |
| 5,946,330 A * | 8/1999 | Ozygus et al. | 372/19 |
| 5,953,360 A | 9/1999 | Vitruk et al. | 372/87 |
| 5,978,394 A | 11/1999 | Newman et al. | 372/32 |
| 5,991,324 A | 11/1999 | Knowles et al. | 372/57 |
| 5,999,555 A * | 12/1999 | Connors et al. | 372/99 |
| 6,005,879 A | 12/1999 | Sandstrom et al. | 372/25 |
| 6,016,325 A | 1/2000 | Ness et al. | 372/38 |
| 6,018,537 A | 1/2000 | Hofmann et al. | 372/25 |
| 6,028,880 A | 2/2000 | Carlesi et al. | 372/58 |
| 6,067,311 A | 5/2000 | Morton et al. | 372/57 |
| 6,094,448 A | 7/2000 | Fomenkov et al. | 372/102 |
| 6,104,735 A | 8/2000 | Webb | 372/37 |
| 6,128,323 A | 10/2000 | Myers et al. | 372/38 |
| 6,151,349 A | 11/2000 | Gong et al. | 372/58 |
| 6,164,116 A | 12/2000 | Rice et al. | 73/1.72 |
| 6,192,064 B1 | 2/2001 | Algots et al. | 372/99 |
| 6,208,674 B1 | 3/2001 | Webb et al. | 372/57 |
| 6,208,675 B1 | 3/2001 | Webb | 372/58 |
| 6,212,211 B1 | 4/2001 | Azzola et al. | 372/33 |
| 6,219,368 B1 | 4/2001 | Govorkov | 372/59 |
| 6,240,117 B1 | 5/2001 | Gong et al. | 372/58 |
| 6,314,119 B1 | 11/2001 | Morton | 372/57 |
| 6,317,447 B1 | 11/2001 | Partlo et al. | 372/57 |
| 6,330,261 B1 | 12/2001 | Ishihara et al. | 372/38.1 |
| 6,414,979 B2 | 7/2002 | Ujazdowski et al. | 372/87 |
| 6,477,193 B2 | 11/2002 | Oliver et al. | 372/58 |
| 6,535,531 B1 | 3/2003 | Smith et al. | 372/25 |
| 6,693,939 B2 | 2/2004 | Klene et al. | 372/58 |
| 6,704,340 B2 | 3/2004 | Ershov et al. | 372/58 |

* cited by examiner

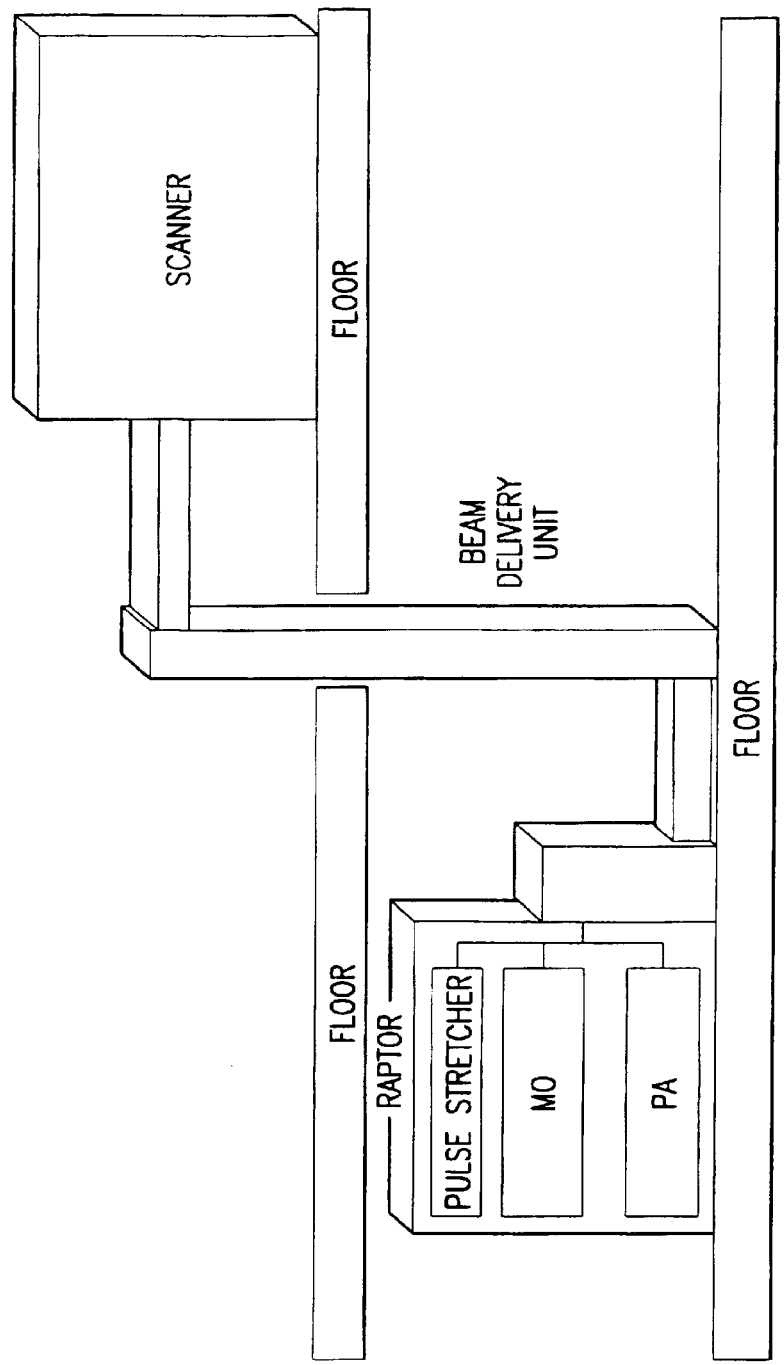

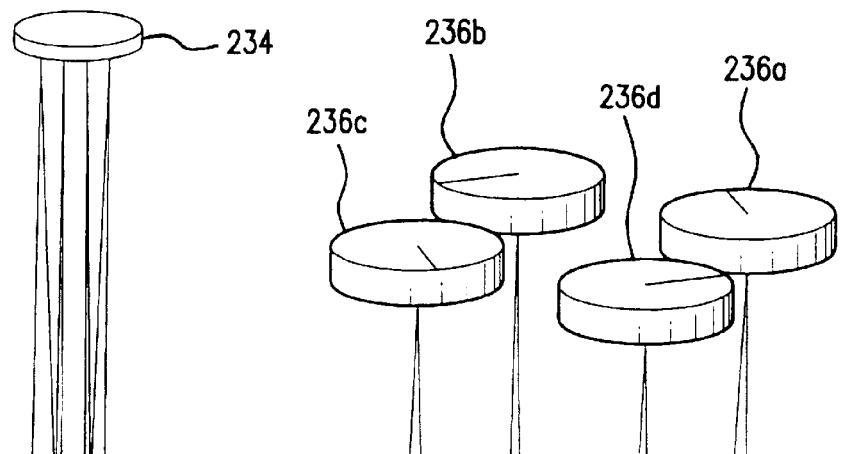
FIG.14B
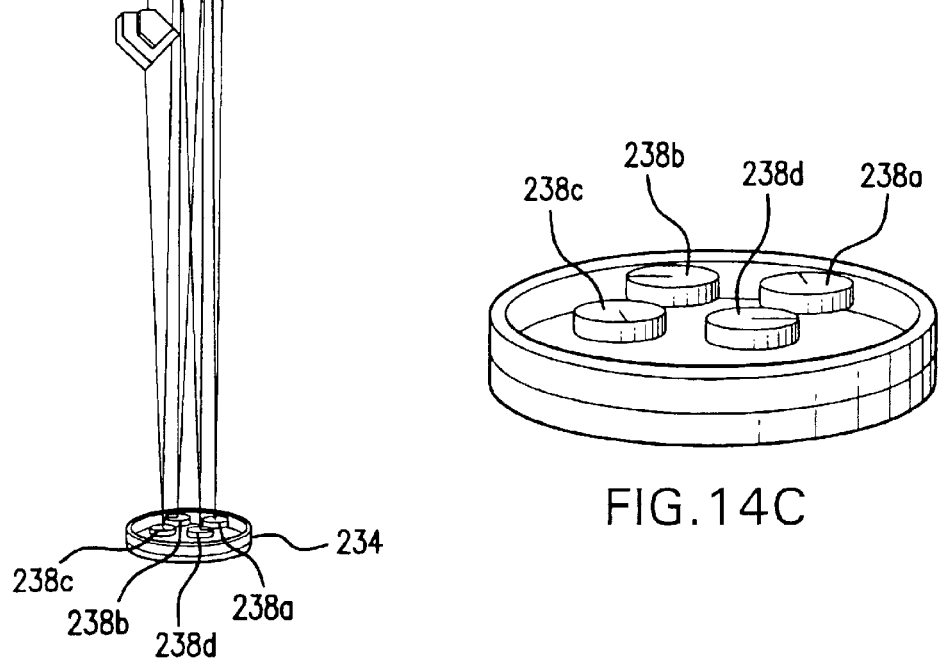
FIG.14C
FIG.14A

LONG DELAY AND HIGH TIS PULSE STRETCHER

The present invention is a continuation-in-part of Ser. No. 10/141,216, filed May 7, 2002 now U.S. Pat. No. 6,693,939 and is incorporated herein by reference.

BACKGROUND OF THE INVENTION

Electric Discharge Gas Lasers

Electric discharge gas lasers are well known and have been available since soon after lasers were invented in the 1960s. A high voltage discharge between two electrodes excites a laser gas to produce a gaseous gain medium. A resonance cavity containing the gain medium permits stimulated amplification of light which is then extracted from the cavity in the form of a laser beam. Many of these electric discharge gas lasers are operated in a pulse mode.

U.S. Pat. No. 6,625,191, entitled VERY NARROW BAND, TWO CHAMBER, HIGH REP RATE GAS DISCHARGE LASER SYSTEM, issued to Knowles, et al. on Sep. 23, 2003, U.S. Pat. No. 6,535,531, entitled GAS DISCHARGE LASER WITH PULSE MULTIPLIER, issued to Smith, et al. on Mar. 18, 2003, U.S. Pat. No. 6,314,119, entitled EXCIMER LASER WITH PULSE AND BEAM MULTIPLIER, issued to Morton on Nov. 6, 2001, U.S. Pat. No. 6,067,311, entitled EXCIMER LASER WITH PULSE MULTIPLIER, issued to Morton, et al. on May 23, 2000; United States Published Patent Application No. 20030138019A1, entitled TWO CHAMBER F2 LASER SYSTEM WITH F2 PRESSURE BASED LINE SELECTION, with inventors Rylov et al. published on Jul. 24, 2003, United States Published Patent Application No. 20030091087A1, entitled LITHOGRAPHY LASER SYSTEM WITH IN-PLACE ALIGNMENT TOOL, with inventors Ershov et al. published on May 15, 2003 and United States Published Patent Application No. 20020191654A1, entitled LASER LITHOGRAPHY LIGHT SOURCE WITH BEAM DELIVERY, with inventors Klene, et al., published on Dec. 19, 2002 relate to pulse stretchers for laser lithography light sources, the disclosures of which are hereby incorporated by reference.

Excimer Lasers

Excimer lasers are a particular type of electric discharge gas laser and they have been known since the mid 1970s. A description of an excimer laser, useful for integrated circuit lithography, is described in U.S. Pat. No. 5,023,884 issued Jun. 11, 1991 entitled "Compact Excimer Laser." This patent has been assigned to Applicants' employer, and the patent is hereby incorporated herein by reference. The excimer laser described in patent '884 is a high repetition rate pulse laser.

These excimer lasers, when used for integrated circuit lithography, are typically operated in an integrated circuit fabrication line "around-the-clock" producing many thousands of valuable integrated circuits per hour; therefore, down-time can be very expensive. For this reason most of the components are organized into modules which can be replaced within a few minutes. Excimer lasers used for lithography typically must have its output beam reduced in bandwidth to a fraction of a picometer. This "line-narrowing" is typically accomplished in a line narrowing module (called a "line narrowing package" or "LNP" for KrF and ArF lasers) which forms the back of the laser's resonant cavity (A line selection unit "LSU" is used for selecting a narrow spectral band in the $F_2$ laser). The LNP is comprised of delicate optical elements including prisms, mirrors and a grating. Electric discharge gas lasers of the type described in patent '884 utilize an electric pulse power system to produce the electrical discharges, between the two elongated electrodes. In such prior art systems, a direct current power supply charges a capacitor bank called a "charging capacitor" or "$C_0$" to a predetermined and controlled voltage called the "charging voltage" for each pulse. The magnitude of this charging voltage may be in the range of about 500 to 1000 volts in these prior art units. After $C_0$ has been charged to the predetermined voltage, a solid state switch is closed allowing the electrical energy stored on $C_0$ to ring very quickly through a series of magnetic compression circuits and a voltage transformer to produce high voltage electrical potential in the range of about 16,000 volts (or greater) across the electrodes which produce the discharges which lasts about 20 to 50 ns.

Major Advances in Lithography Light Sources

Excimer lasers such as described in the '884 patent have during the period 1989 to 2001 become the primary light source for integrated circuit lithography. More than 1000 of these lasers are currently in use in the most modern integrated circuit fabrication plants. Almost all of these lasers have the basic design features described in the '884 patent. This is:

(1) a single, pulse power system for providing electrical pulses across the electrodes at pulse rates of about 100 to 2500 pulses per second;

(2) a single resonant cavity comprised of a partially reflecting mirror-type output coupler and a line narrowing unit consisting of a prism beam expander, a tuning mirror and a grating;

(3) a single discharge chamber containing a laser gas (either krypton, fluorine and neon for KrF or argon, fluorine and neon for ArF), two elongated electrodes and a tangential fan for circulating the laser gas between the two electrodes fast enough to clear the discharge region between pulses, and (4) a beam monitor for monitoring pulse energy, wavelength and bandwidth of output pulses with a feedback control system for controlling pulse energy, energy dose and wavelength on a pulse-to-pulse basis.

During the 1989–2001 period, output power of these lasers has increased gradually and beam quality specifications for pulse energy stability, wavelength stability and bandwidth have become increasingly tighter. Operating parameters for a popular lithography laser model used widely in integrated circuit fabrication include pulse energy at 8 mJ, pulse rate at 2,500 pulses per second (providing an average beam power of up to about 20 watts), bandwidth at about 0.5 $\mu$m full width half maximum (FWHM) and pulse energy stability at +/−0.35%.

Injection Seeding

A well-known technique for reducing the bandwidth of gas discharge laser systems (including excimer laser systems) involves the injection of a narrow band "seed" beam into a gain medium. In some of these systems a laser producing the seed beam called a "master oscillator" is designed to provide a very narrow bandwidth beam in a first gain medium, and that beam is used as a seed beam in a second gain medium. If the second gain medium functions as a power amplifier, the system is referred to as a master oscillator, power amplifier (MOPA) system. If the second gain medium itself has a resonance cavity (in which laser oscillations take place), the system is referred to as an injection seeded oscillator (ISO) system or a master oscillator, power oscillator (MOPO) system in which case the seed laser is called the master oscillator and the downstream system is called the power oscillator. Laser systems comprised of two separate systems tend to be substantially more expensive, larger and more complicated to build and operate than comparable single chamber laser systems. Therefore, commercial application of these two chamber laser systems has been limited.

Separation of Lithography Machine from Light Source

For integrated circuit fabrication the lithography machine is typically located separate from the lithography laser light source. The separation is typically 2 to 20 meters. Sometimes the laser and the lithography machine are located in separate rooms. A typical practice is to locate the laser in a room one floor below the lithography machine. The laser beam is ultraviolet at wavelengths of about 248 nm for KrF lasers, 193 nm for ArF lasers and 157 nm for $F_2$ lasers. Ultraviolet light especially at the shorter wavelengths of the ArF and $F_2$ lasers is absorbed by oxygen, therefore it is a well known practice to enclose the laser beam path between the laser and the lithography with and to purge the enclosure with a gas such as nitrogen which provides much lower beam attenuation than air. Included within the enclosure also are a variety of optical components including mirrors and lenses for directing the laser beam to a desired beam entrance port in the lithography machine and providing any needed modification to the beam, such as changes in cross-sectional profile. The equipment for delivering the laser beam to the lithography machine is called a beam delivery unit or "BDU" for short. In the past the BDU has typically been designed and supplied separate from the laser light source.

What is needed is a better laser design for a pulse gas discharge laser for operation at repetition rates in the range of about 4,000 pulses per second or greater, providing laser light at the entrance port of the lithography machine having beam quality parameters including wavelength, bandwidth, pulse energy and cross-sectional profile needed by the lithography machine.

In addition, as the lithography manufacturers demand even further increases in TIS out to 200 ns and above, it is important to have a simple and easy way to produce such laser lithography light sources, which remain robust in the delivery of such stretched pulses while maintaining important parameters that impact dose at the wafer, including, e.g., beam direction and beam pointing, beam wavefront parameters, and the like. Such a pulse stretcher must be able to be easily attached to and aligned with a laser system, either for delivery as part of the laser system or as a subsequent add-on, and must retain such alignment, preferably by being secured to the laser system and/or its frame, be easily attachable to the beam path purge system of the laser and efficiently deliver the stretched pulses to the lithography tool, preferably with no change in the interface to the lithography tool. In order to accomplish some of these goals, the external pulse stretcher must fit within substantially the same footprint as the laser system's existing frame, i.e., about 6 ft. 3 in. high by about 32 in. wide.

SUMMARY OF THE INVENTION

A method and apparatus for laser light pulse stretching is disclosed which may comprise a beam splitter in the path of a laser output light pulse beam; selected to pass a first percent of the energy of a first input pulse of the laser output light pulse beam along a laser output light pulse beam output path as a first output pulse and to reflect a second percent of the energy of the laser output light pulse beam into a first delayed beam; an optical delay path receiving the first delayed beam and returning the first delayed beam to the beam splitter in an orientation such that a third percent of the first delayed beam is reflected into the output path as a second output pulse and a fourth percent is passed into the optical delay path as a second delayed beam; the optical delay path receiving the second delayed beam and returning the second delayed beam to the beam splitter in an orientation such that the third percent of the second delayed beam is reflected into the output path as a third output pulse and the fourth percent of the second delayed beam is passed into the optical delay path as a third delayed beam; the optical delay path receiving the third delayed beam and returning the third delayed beam to the beam splitter in an orientation such that the third percent of the third delayed beam is reflected into the output path as a fourth output pulse; the first input pulse being a first pulse in a plurality of pulses output from a prior pulse stretcher, each of a plurality of succeeding input pulses comprising the output of the prior pulse stretcher resulting from the stretching of a narrow band laser light output pulse, forming successive first, second, third and fourth output pulses, the combination of which forms a pulse stretcher having an output with a TIS of at least 200 ns. The optical delay path may be formed of a plurality of at least eight reflecting mirrors and contained in an elongated enclosure having first and second end plates mounting a first group of at least four of the at least eight reflecting mirrors mounted on the first mounting surface symmetrically about a center axis of the optical delay path and a second group of at least four of the at least eight reflecting mirrors mounted on the second mounting surface symmetrically about the center axis. The mirrors may be staggered in a predefined pattern, e.g., a circular pattern. The delay path may lie in a plurality of planes. The apparatus may be part of a laser system, part of a beam delivery system or an interface between the two.

BRIEF DESCRIPTION OF THE DRAWINGS

FIGS. 4A, 4B and 4C show beam delivery configurations;

FIGS. 14a–c, respectively show details of the optical arrangements shown in FIGS. 11 and 12 in perspective and ex0ploded views according to an embodiment of the present invention;

DETAILED DESCRIPTION OF PREFERRED EMBODIMENTS

Figure 1:
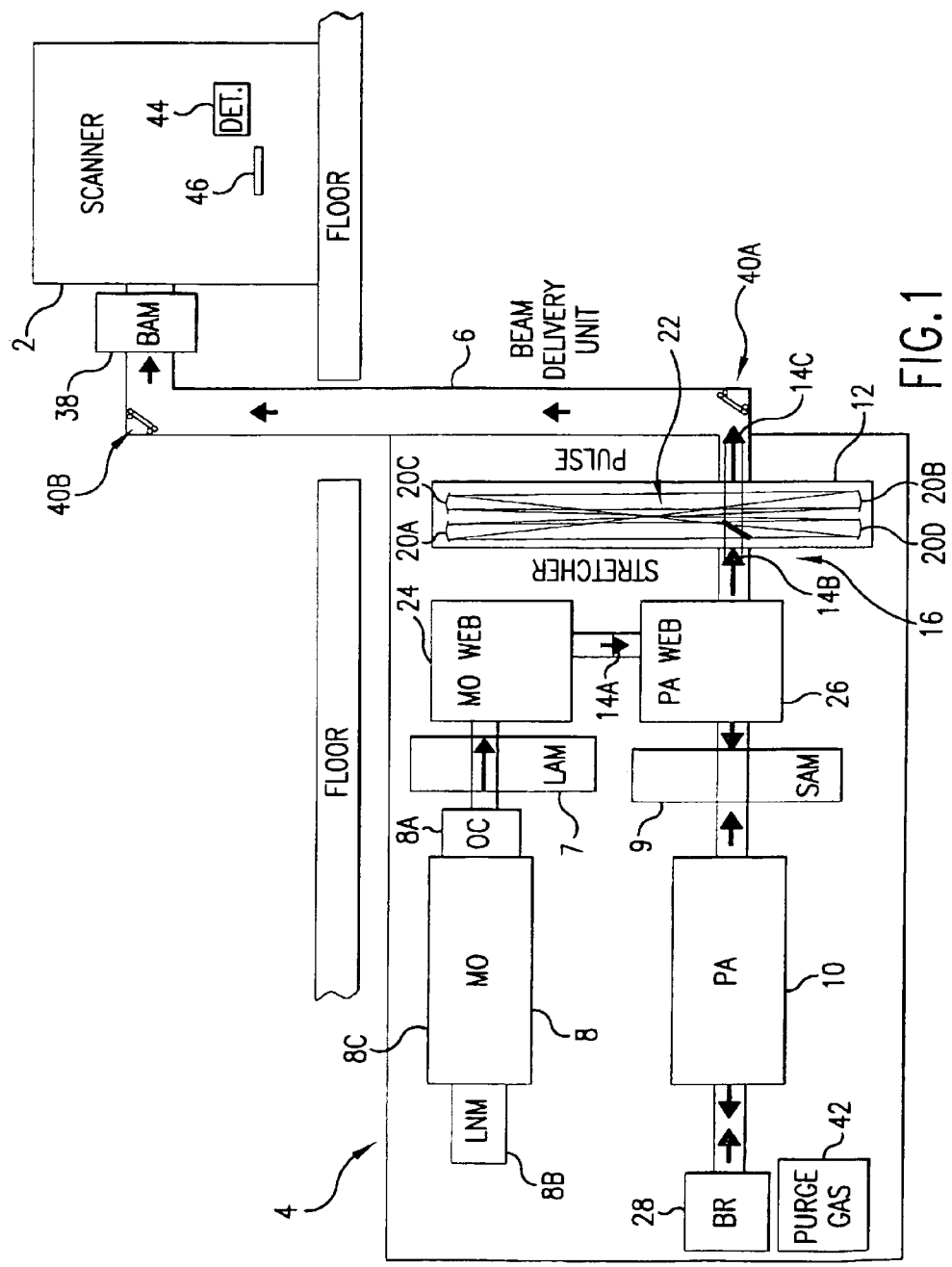
FIG. 1 is a layout of a lithography laser system with a beam delivery unit.

A first preferred embodiment of the present invention is shown in FIG. 1. In this embodiment a 193 nm ultraviolet laser beam is provided at the input port of a stepper lithography machine 2 such, as the one of those supplied by Canon and Nikon with facilities in Japan and ASML with facilities in the Netherlands. In this case the main components of the laser system 4 are installed below the deck on which the scanner is installed. However, this laser system includes a beam delivery unit 6 which provides an enclosed beam path for delivering the laser beam to the input port of the scanner.

This particular laser system includes a master oscillator and a power amplifier 10 and is a type of laser system known as MOPA system. This MOPA arrangement represents an important advancement in integrated circuit light sources over the prior art technique of using a single laser oscillator to provide the laser light. The master oscillator and the power amplifier each comprise a discharge chamber similar to the discharge chamber of prior art single chamber lithography laser systems. These chambers contain two elongated electrodes, a laser gas, a tangential for circulating the gas between the electrodes and water-cooled finned heat exchangers. The master oscillator produces a first laser beam 14A which is amplified by two passes through the power amplifier to produce laser beam 14B. The master oscillator 8 comprises a resonant cavity formed by output coupler 8A and line narrowing package 8B both of which are described generally in the background section and in detail in the referenced prior art patents. The gain medium for master oscillator 8 is produced between two 50-cm long electrodes contained within master oscillator discharge chamber 8C. Power amplifier 10. It is basically a discharge chamber and in this preferred embodiment is almost exactly the same as the master oscillator discharge chamber 8C providing a gain medium between two elongated electrodes but it has no resonant cavity. This MOPA configuration permits the master the master oscillator to be designed and operated to maximize beam quality parameters such as wavelength stability, very narrow bandwidth; whereas the power amplifier is designed and operated to maximize power output. For example, the current state of the art light source available from Cymer, Inc. Applicants' employer, is a 5 mJ per pulse, 4 kHz, ArF laser system. The system shown in FIG. 1 is a 10 mJ per pulse (or more, if desired) 4 kHz ArF laser system producing at least twice the average ultraviolet power with substantial improvement in beam quality. For this reason the MOPA system represents a much higher quality and much higher power laser light source.

Pulse Stretcher

Figure 2:
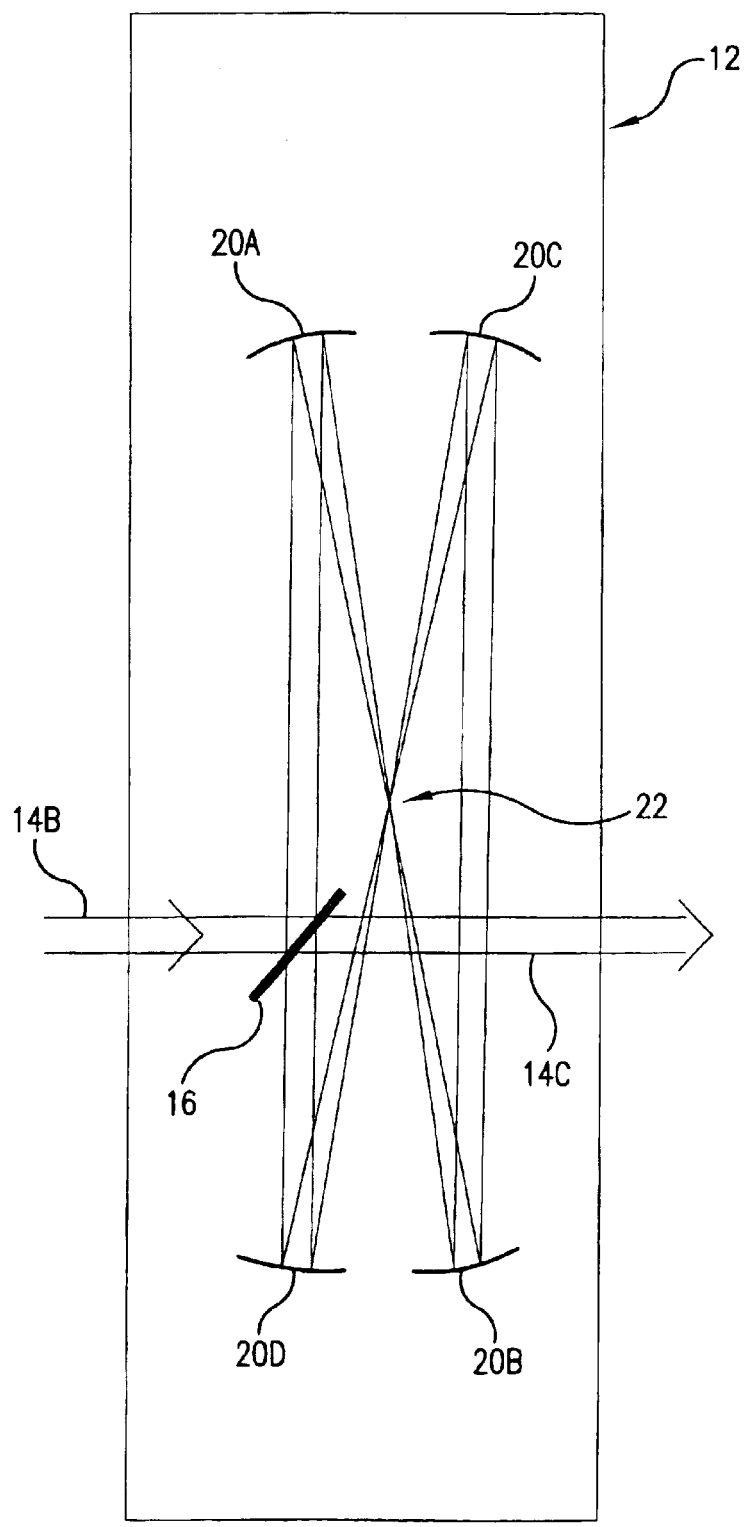
FIGS. 2, 2A and 2B show features of a pulse stretching unit.
Figure 2A:
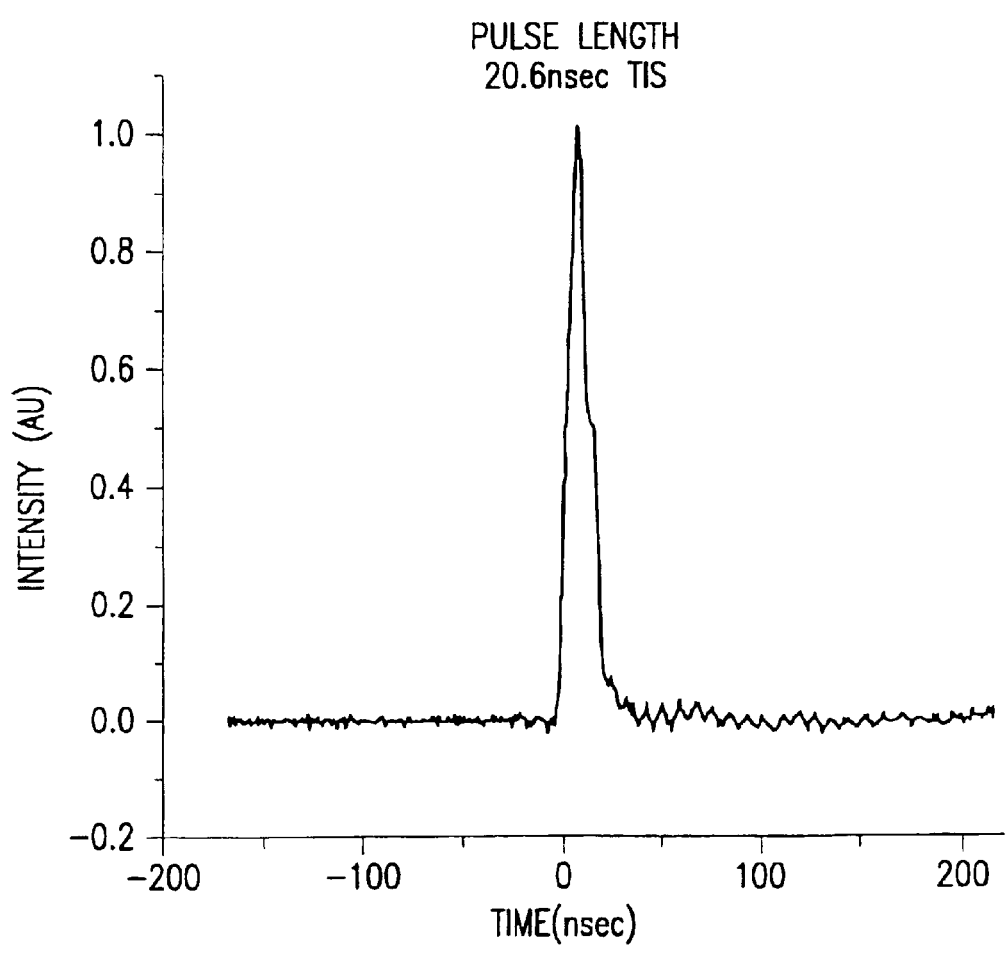
Figure 2B:
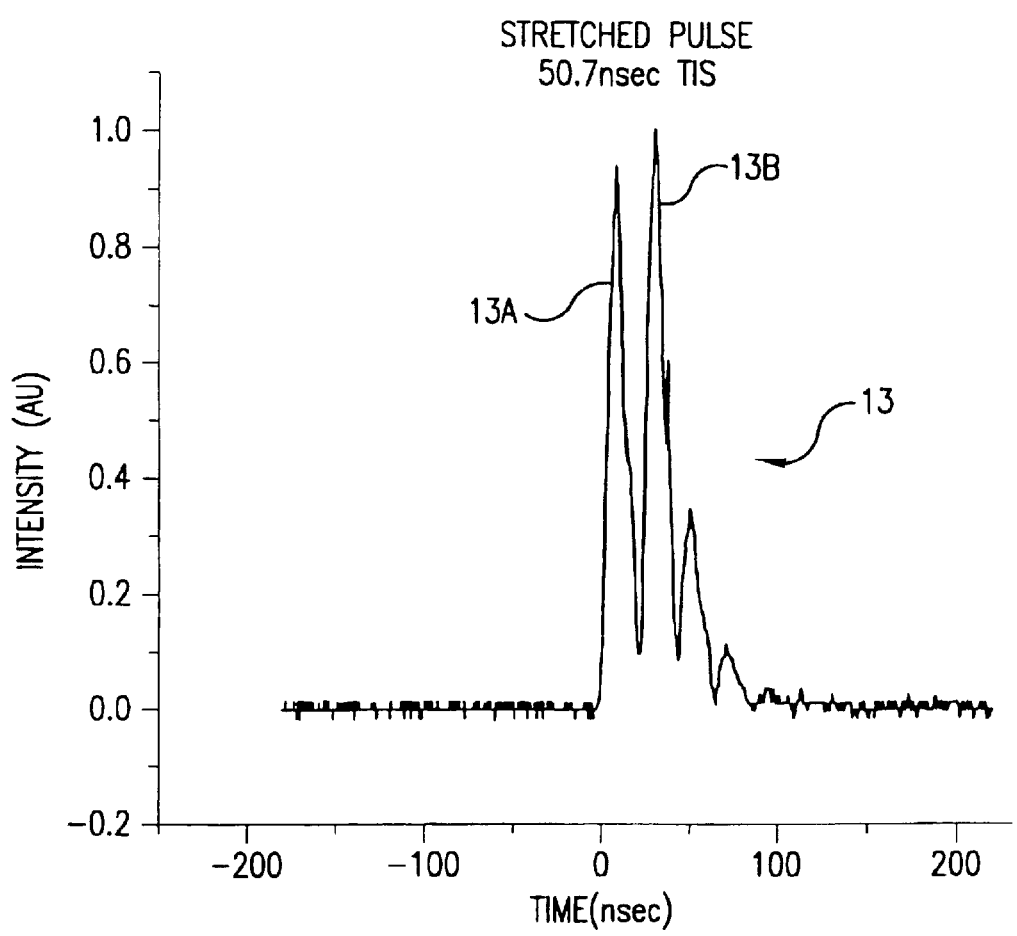

Integrated circuit scanner machines comprise large lenses which are difficult to fabricate and costs millions of dollars. These very expensive optical components are subject to degradation resulting from billions of high intensity and ultraviolet pulses. Optical damage is known to increase with increasing intensity (i.e., light power (energy/time) per $cm^2$ or $mJ/ns/cm^2$) of the laser pulses. The typical pulse length of the laser beam from these lasers is about 20 ns so a 5 mJ beam would have a pulse power intensity of about 0.25 mJ/ns. Increasing the pulse energy to 10 mJ without changing the pulse duration would result a doubling of the power of the pulses to about 0.5 mJ/ns which could significantly shorten the usable lifetime of these expensive optical components. The Applicants have avoided this problem by increasing substantially the pulse length from about 20 ns to more than 50 ns providing a reduction in the rate of scanner optics degradation. This pulse stretching is achieved with pulse stretcher unit 12 as shown in FIG. 1. An enlarged view showing the beam paths through pulse stretcher 12 is shown in FIG. 2. A beam splitter 16 reflects about 60 percent of the power amplifier output beam 14B into a delay path created by four focusing mirrors 20A, 20B, 20C and 20D. The 40 percent transmitted portion of each pulse of beam 14B becomes a first hump 13A of a corresponding stretched pulse 13 shown in FIG. 2B of beam 14C. The stretched beam 14C is directed by beam splitter 16 to mirror 20A which focuses the reflected portion to point 22. The beam then expands and is reflected from mirror 20B which converts the expanding beam into a parallel beam and directs it to mirror 20C which again focuses the beam again at point 22. This beam is then reflected by mirror 20D which like the 20B mirror changes the expanding beam to a light parallel beam and directs it back to beam splitter 16 where 60 percent of the first reflected light is reflected perfectly in line with the first transmitted portion of this pulse in output beam 14C to become most of hump 13B in pulse 13 as shown in FIG. 2B. The 40 percent of the reflected beam transmits beam splitter 14 and follows exactly the path of the first reflected beam producing additional smaller humps in stretched pulse 13. The result is stretched pulse 14C which is stretched in pulse length from about 20 ns to about 50 ns. The stretch pulse 14C is plotted as intensity vs. time in FIG. 2B and can be compared with the shape of the power amplifier output pulse 14B which is similarly plotted in FIG. 2A.

The stretched pulse shape with this embodiment has two large approximately equal peaks 13A and 13B with smaller diminishing peaks following in time the first two peaks. The shape of the stretched pulse can be modified by using a different beam splitter. Applicants' have determined that a beam splitter reflecting about 60 percent produces the maximum stretching of the pulse as measured by a parameter known as the "time integrated square" pulse length or "TIS". Use of this parameter is a technique for determining the effective pulse duration of pulses having oddly shaped power vs. time curves. The TIS defined as:

$$t_{IS} = \frac{\left(\int I(t)dt\right)^2}{\int I^2(t)dt}$$

Where I(t) is the intensity as a function of time.

In order to maintain the beam profile and divergence properties, the mirrors that direct the beam through the delay propagation path must create an imaging relay system that also should act as a unity, magnification, afocal telescope. The reason for this is because of the intrinsic divergence of the excimer laser beam. If the beam were directed through a delay path without being imaged, the beam would be a different size than the original beam when it is recombined at the beam splitter. To create the imaging relay and afocal telescope functions of the pulse stretcher the mirrors are designed with a specific radius of curvature which is determined by the length of the delay path. The separation between mirrors 20A and 20D is equal to the radius of curvature of the concave surfaces of the mirrors and is equal to ¼ the total delay path.

The relative intensities of the first two peaks in the stretched pulse can be modified with the design of the reflectivity of the beam splitter. Also, the design of the beam splitter and therefore the output TIS of the pulse stretcher are dependent upon the efficiency of the beam relay system and therefore the output TIS is also subject to the amount of reflectivity of the imaging relay mirrors and the amount of loss at the beam splitter. For an imaging relay mirror reflectivity of 97% and a loss of 2% at the beam splitter, the maximum TIS magnification occurs when the reflectivity of the beam splitter is 63%.

The alignment of the pulse stretcher requires that two of the four imaging relay mirrors be adjustable. Each of the two adjustable mirrors would have tip/tilt adjustment creating a total of four degrees of freedom. It is necessary that the two adjustable mirrors be located at opposite ends of the system because of the confocal design of the system. To create a self-aligning pulse stretcher would require automated adjustment of the necessary four degrees of freedom and a diagnostic system which could provide feedback information to characterize the alignment. The design of such a diagnostic system, which could qualify the alignment performance, would require an imaging system capable of imaging both the near field and far field output of the pulse stretcher. By examining the overlay of the sub-pulses with the original pulse at two planes (near field and far field) one would have the necessary information to automatically adjust the mirrors to produce an output where each of the sub-pulses propagate in a co-linear manner with the original pulse.

Relay Optics

In this preferred embodiment the output beam 14A of the master oscillator 8 is amplified by two passes through power amplifier 10 to produce output beam 14B. The optical components to accomplish this are contained in three modules which Applicants have named: master oscillator wave front engineering box, MO WEB, 24, power amplifier wavefront engineering box, PA WEB, 26 and beam reverser, BR, 28. These three modules along with line narrowing module 8B and output coupler 8A are all mounted on a single vertical optical table independent of discharge chamber 8C and the discharge chamber of power amplifier 10. Chamber vibrations caused by acoustic shock and fan rotation must be isolated from the optical components.

Figure 3A:
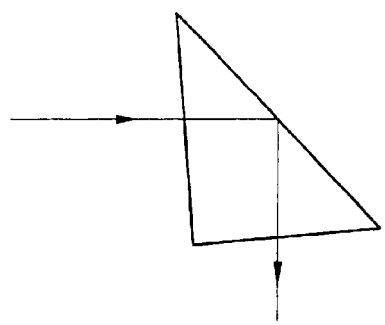
FIGS. 3A, 3B, 3C, 3D, 3E, 3F and 3G show features of a relay optics for the FIG. 1 laser system.

The optical components in the master oscillator line narrowing module and output coupler are in this embodiment substantially the same as those of prior art lithography laser light sources referred to in the background section. The line narrowing module includes a three or four prism beam expander, a very fast response tuning mirror and a grating disposed in Litrow configuration. The output coupler is a partially reflecting mirror reflecting 20 percent of the output beam for KrF systems and about 30 percent for ArF and passing the remainder. The output of master oscillator 8 is monitored in line center analysis module, LAM, 7 and passes into the MO WEB 24. The MO WEB contains a total internal reflection (TIR) prism and alignment components for precisely directing the output beam 14A into the PA WEB. TIR prisms such as the one shown in FIG. 3A can turn a laser beam 90 degrees with more than 90 percent efficiency without need for reflective coatings which typically degrade under high intensity ultraviolet radiation. Alternatively, a first surface mirror with a durable high reflection coating could be used in place of the TIR prism.

The PA WEB 26 contains a TIR prism 26A as shown in FIGS. 3C–F and alignment components (not shown) for directing laser beam 14A into a first pass through power amplifier gain medium. Alternatively, as above a first surface mirror with a high reflection coating could be substituted for the TIR prism. The beam reverser module 28 contains a two-reflection beam reversing prism 26B shown in FIGS. 3B-D that like the one-reflection prism shown in FIG. 3A relies on total internal reflection and therefore requires no optical coatings. The face where the P-polarized beam enters and exits the prism is oriented at Brewster's angle to minimize reflection lasers, making the prism almost 100% efficient.

Figure 3B:
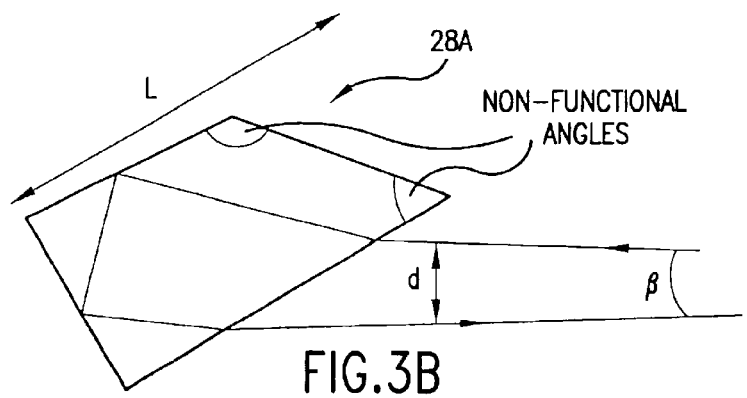
Figure 3C:
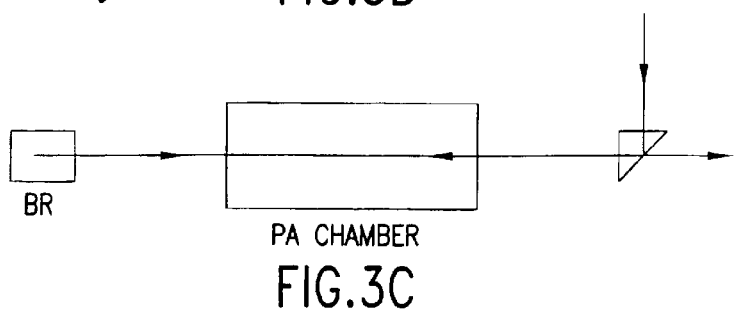
Figure 3D:
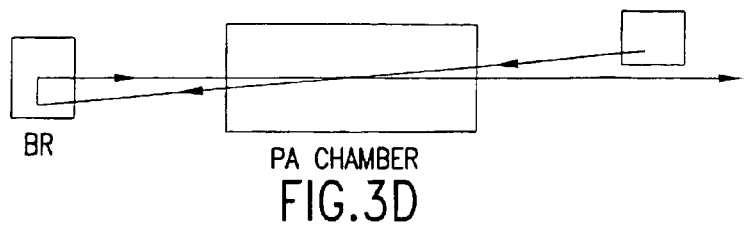

After reversal in the beam reversing module 28, partially amplified beam 14A makes another pass through the gain medium in power amplifier 10 and exits through spectral analysis module 9 and PA WEB 26 as power amplifier output beam 14B. In this embodiment the second pass of beam 14A through power amplifier 10 is precisely in line with the elongated electrodes within the power amplifier discharge chamber. The first pass follows a path at an angle of about 6 milliradians relative to the path of the second pass and the first path of the first pass crosses the center line of the gain medium at a point half way between the two ends of the gain medium. FIGS. 3C and 3D show side and top views of the path of beam 14A through the power amplifier. The reader should note that the design and positioning of beam reversing prism 28A must accommodate an angle β and a spatial offset of d as shown in FIG. 3B. In this embodiment β=6 milliradians and d is equal to 5 mm.

Figure 3E:
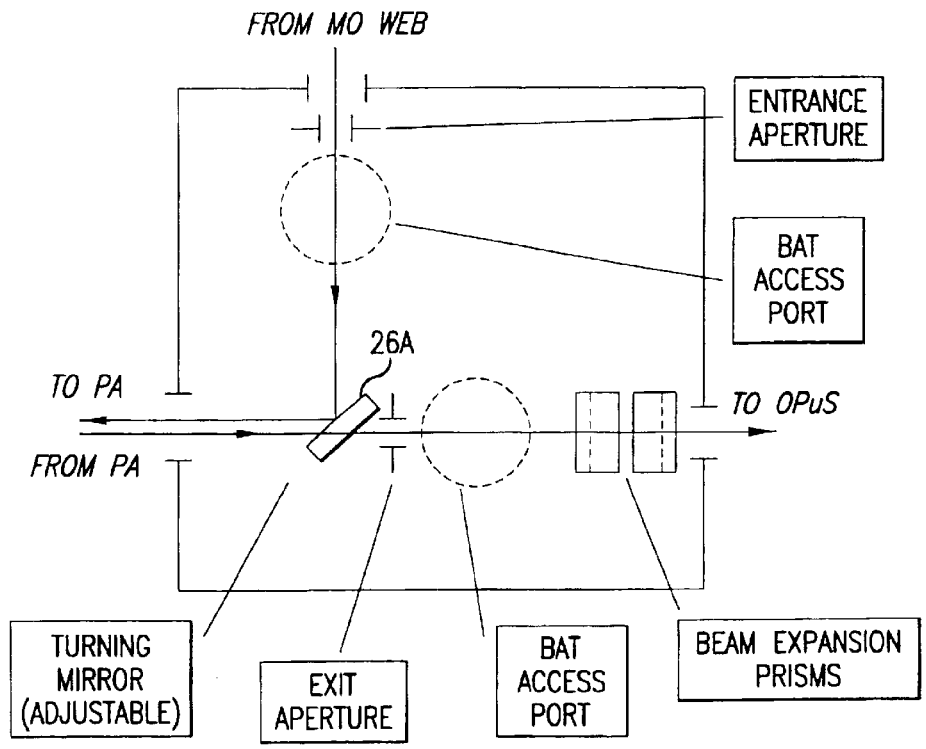
Figure 3F:
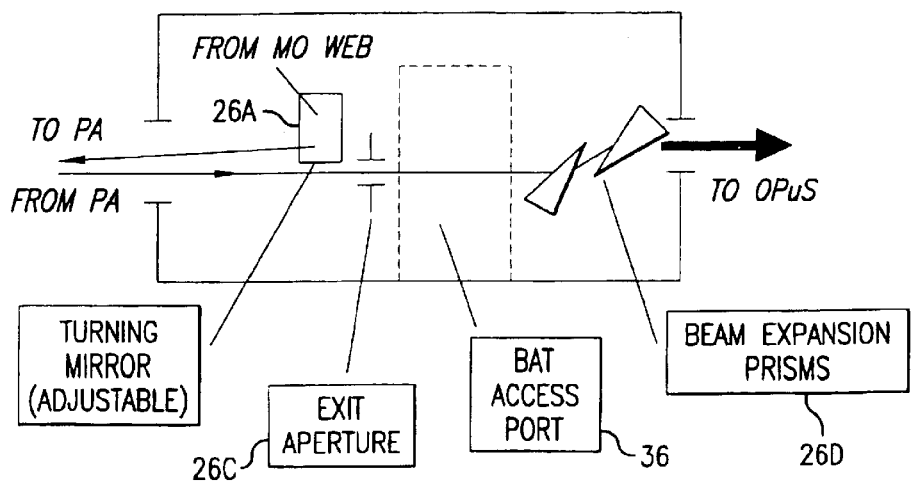

FIGS. 3E (side view) and 3F (top view) show some additional important features of optics in power amplifier WEB module. Note that in the side view, the beam "to" the PA is shown above the beam "from" the PA. This is done so that both beams can be shown in the side view drawing. (Actually both beams are at the same elevation so that the "from" beam would block the "to" beam if the from beam were shown at the correct elevation.). As shown in FIG. 3F the from beam passes close to TIR prism 26A passes through exit aperture 26C, and is expanded by a factor of 4 in the horizontal direction with two beam expanding prism 26D and exits to pulse stretches module 22 (called by Applicants' "OPUS", for optical pulse stretcher). Exit aperture 26C as well as other apertures in the relay optics should be considered optional and they may be replaced by temporary alignment targets.

Other TIR Prism Considerations

TIR prisms in the MO WEB and PA WEB are preferred over dielectric-coated first surface mirrors because they have no optical coatings, which tend to degrade with extended exposure to high fluence UV radiation. One disadvantage of the TIR prisms is unwanted Fresnel reflections that occur at the entrance and exit faces. For calcium fluoride material at 193 nm, each face reflects about 4% of the incident beam. If the incident beam is normal to the surface, the unwanted reflections will propagate back along the path of the incident beam and re-enter the MO. This could interfere with the stable operation of the MO. The problem is avoided by tilting the entrance and exit faces of the TIR prisms by approximately 1 degree relative to the incident beam. This can be accomplished by rotation a 45°–45°–90° TIR prism by 1 degree, in which case the deviation angle of the primary beam will change from 90° to either 88° or 92° (depending on the direction of the 1 degree rotation). Alternatively, a 90° deviation angle and 1 tilted faces can be achieved by using a TIR prism with angles 44°–44°–92° or 46°–46°–88° or 44.33°–45.67°–90°.

The TIR prism 26A in the PA WEB is used very close to an edge of each of the three optical faces. The optical faces of these prisms must be accurately polished to within 1 mm or less of the critical edges.

The TIR prisms in the MO WEB and PA WEB will each be alignable in two degrees of freedom (2 rotations, "tip-tilt"). The MO WEB TIR prism is aligned so that the primary reflected beam is directed to the appropriate location in the PA WEB. The PA WEB TIR prism is aligned so that the primary reflected beam is reflected beam is directed to the appropriate location in the Beam Reverser. Each TIR prism is secured in a mechanical mount which allows the tip-tilt adjustments from outside the sealed module.

The maximum reflected wavefront error is specified as 0.20 wave peak-valley at 633 nm (i.e., 127 nm) across the clear aperture (13 mm×21 mm). The wavefront error across the much smaller beam will be significantly less, though the exact amount depends on the type of aberrations present. If simple curvature is the dominant error (as it generally is with polished flats), the maximum divergence angle error introduced to beam would be about 0.02 mrad in the vertical direction (and much less in the horizontal direction).

Figure 3G:
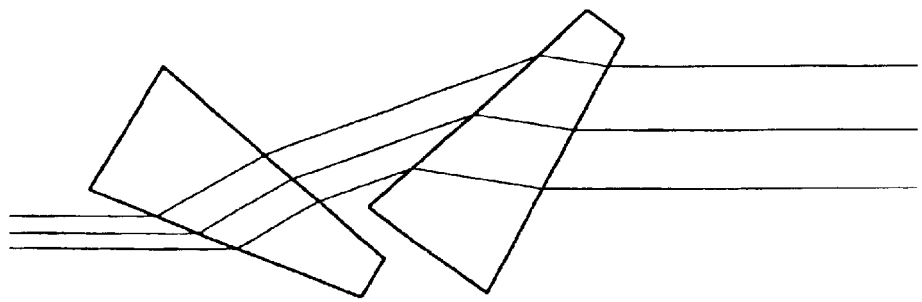

Degradation of the optical coating over life (especially at 193 nm) is a concern, high reflection dielectric coatings that are more damage resistant than partial reflection or AR coatings. Also aiding the goal of long lifetime for this mirror is the fact that the pulse energy is much lower coming out of the MO than coming out of the PA. Because the mirror will be used very close to the edge, the coating may be more susceptible to damage. There may be surface roughness or coating irregularities near the edge that contribute to coating failure. The edge of the mirror preferably is tested to avoid these potential problems. FIG. 3G shows the spacing issues. In order to direct the beam to the appropriate location in the Beam Reverser module, the turning mirror will be aligned in two degrees of freedom (2 rotations, "tip-tilt"). The mirror mount must include adjustments, accessible from outside the sealed module, for aligning the mirror to the required accuracy.

An alternative to the coated mirror 26A is to use an uncoated TIR prism instead of the dielectric-coated mirror. Such a design would eliminate any concern of coating damage over life.

Alignment Features

For this tilted double-pass geometry, the beams reflecting from the MO WEB and the Beam Reverser are precisely positioned in the PA WEB. Alignment features are provided within the PA WEB for proper alignment of the MO WEB mirror and the Beam Reverser. The features would need to reference to the edge of the TIR prism. Preferably the alignment features are apertures, one at the entrance to the PA WEB (for alignment the MO WEB prism) and one at the exit (for aligning the beam reverser). The apertures might be permanent or removable. The system should be alignable in the field with the beam path sealed. Preferably the location of the beam with respect to the apertures will be made visible with some type of 2-D detector array (digital camera). A Beam Analysis Tool called BAT (perhaps with an aperture built-in) may be inserted into the module to inspect the alignment as shown at 36 in FIG. 3F.

Beam Expansion Prisms

Coming out of the PA, the fluence of the beam is higher than anywhere else in the system (due to small beam size and high pulse energy). To avoid having such high fluence incident on the optical coatings in the OPuS module, where coating damage could result, beam expansion prisms were designed into the PA WEB. By expanding the horizontal beam width by a factor of 4, the fluence is reduced to ¼ its previous level.

The beam expansion is accomplished using a pair of identical prisms with 20° apex angle as shown in FIG. 3H. The orientation of the prisms and beam path is shown FIG. 3G.

The prisms are made of ArF-grade calcium fluoride and are uncoated. By utilizing an incidence angle of 68.6° on each prism, anamorphic magnification of 4.0 is achieved, and the nominal deviation angle of the pair is zero. The total Fresnel reflection loss from the four surfaces is about 12%.

Beam Delivery Unit

In this preferred embodiment a pulsed laser beam meeting requirements specified for the scanner machine 2 is furnished at the light input port of the scanner. A beam analysis module as shown at 38 in FIG. 1 called a BAM is provided at the input port of the scanner to monitor the incoming beam and providing feedback signals to the laser control system to assure that the light provided to the scanner is at the desired intensity, wavelength, bandwidth, and complies with all quality requirements such as dose and wavelength stability. Wavelength, bandwidth and pulse energy are monitored by meteorology equipment in the beam analysis module on a pulse to pulse basis at pulse rates up to 4,000 Hz using techniques described in U.S. patent application Ser. No. 10/012,002 which has been incorporated herein by reference.

Other beam parameters may also be monitored at any desired frequency since these other parameters such as polarization, profile, beam size and beam pointing are relatively stable, may be normally monitored much less frequently than the wavelength, bandwidth and pulse energy parameters.

This particular BDU comprises two beam-pointing mirrors 40A and 40B one or both of which may be controlled to provide tip and tilt correction for variations beam pointing. Beam pointing may be monitored in the BAM providing feedback control of the pointing of one or both of the pointing mirrors. In a preferred embodiment piezoelectric drivers are provided to provide pointing response of less than 7 milliseconds.

Fixed Energy Output

Figure 5:
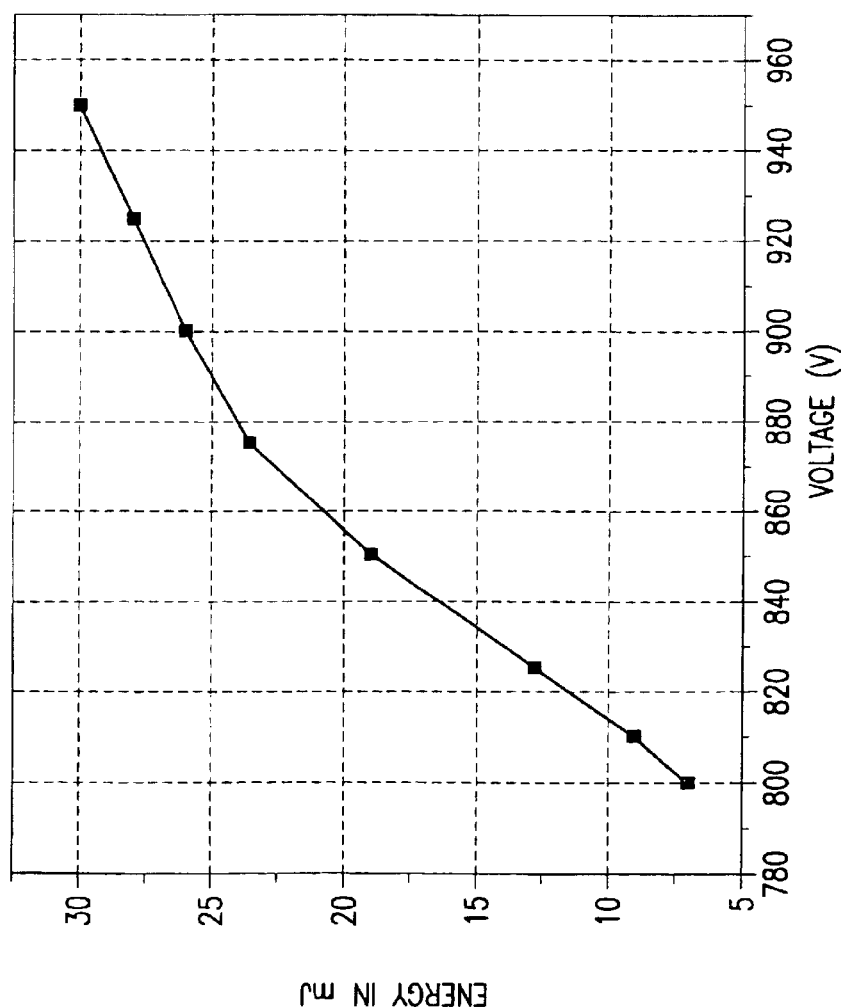
FIG. 5 is a graph of pulse energy versus charging voltage.

In general all optics in the beam path from the gain medium to the silicon wafer degrade over time generally as a function of intensity of the light in each pulse and the number of pulses. However, because of major improvements over the past few years that degradation is slow and is typically measured in billions of pulses. Still, the degradation is significant since, at 4000 Hz, a round-the-clock operation at a 15 percent duty factor, a lithography system will accumulate a billion pulses in a about three weeks. For this reason maintaining constant beam quality can be a challenge. In the past this effort to maintain consistent beam quality over the life of the components of the lithography system has been complicated by the fact that laser beam quality for most laser control functions was measured at the output of the laser system, just downstream from the output coupler. The present invention greatly moderates this problem by providing direct pulse-to-pulse feedback control at the input port of the scanner machine and by supplying the beam delivery unit as a part of the laser system. In this preferred embodiment the beam delivery unit is combined with the above described MOPA system which produces approximately twice the pulse energy as the current state-of-the-art lithography light sources with a reduction in energy intensity and with substantial improvements in beam quality. Therefore, with this arrangement the present invention provides illumination meeting the requirements of the operator of the stepper machine with beam quality and intensity unchanged over the lifetime of the lithography system despite substantial degradation of optical components throughout the length of the beam path. This can be accomplished by intentionally operating the laser system to provide a desired nominal performance at all stages of equipment life. Techniques for intentionally decreasing pulse energy include the usual technique of reducing discharge voltage but also reducing gas pressure of fluorine concentration. Beam attenuation is another possibility. This means that in the early stages of equipment life when all components are new, the laser may be operated so as to produce illumination with less than optimum quality and intensity, but quality and intensity values can be maintained constant (if desired) throughout the life of the lithography system. This approach can substantially increase the useful life not only of the very expensive laser system but also the much more expensive stepper machine. FIG. 5 is a plot of charging voltage vs. pulse energy output for a prototype MOPA laser system built and tested by Applicants. This chart shows that the laser system output can be varied between about 7 mJ to 30 mJ merely by charging the charging voltage. For example, if a nominal operating parameter is 15 mJ, the graph in FIG. 5 demonstrates that there is plenty of excess capacity in the laser to compensate for optics degradation over a long equipment lifetime. Since the MOPA output in this embodiment is 30 mJ per pulse compared to present state-of-the-art laser systems with output of 10 mJ, major lifetime improvements are expected using the above-described plan.

BDU-Part of Laser

Another advantage of providing the laser beam at the entrance port of the scanner is that the beam delivery unit now becomes the responsibility of the laser supplier for not only design and manufacture but also for pro-active preventative maintenance so as to minimize downtime and increase system availability.

Various Laser-BDU-Scanner Configuration

Another advantage is that the beam delivery unit can be designed as part of the laser system to suit the location of the laser with respect to the lithography machine. FIG. 1 shows a typical configuration but most lithography installations are unique and many other configurations are expected to be utilized. Some of the various possible laser—BDU—scanner configurations are shown in FIGS. 4A, 4B, 4C and 4D.

Polarization Considerations

In the master oscillator resonant cavity optical components including two windows and three prisms are oriented with surfaces oriented vertically providing several angles of incident, with the developing laser beam, close to Brewster's angle. Therefore, beam 14A exiting the master oscillator is strongly polarized with about 98 percent of the electric field component of the beam being in the horizontal direction and about 2 percent being in the vertical direction.

Figure 4B:
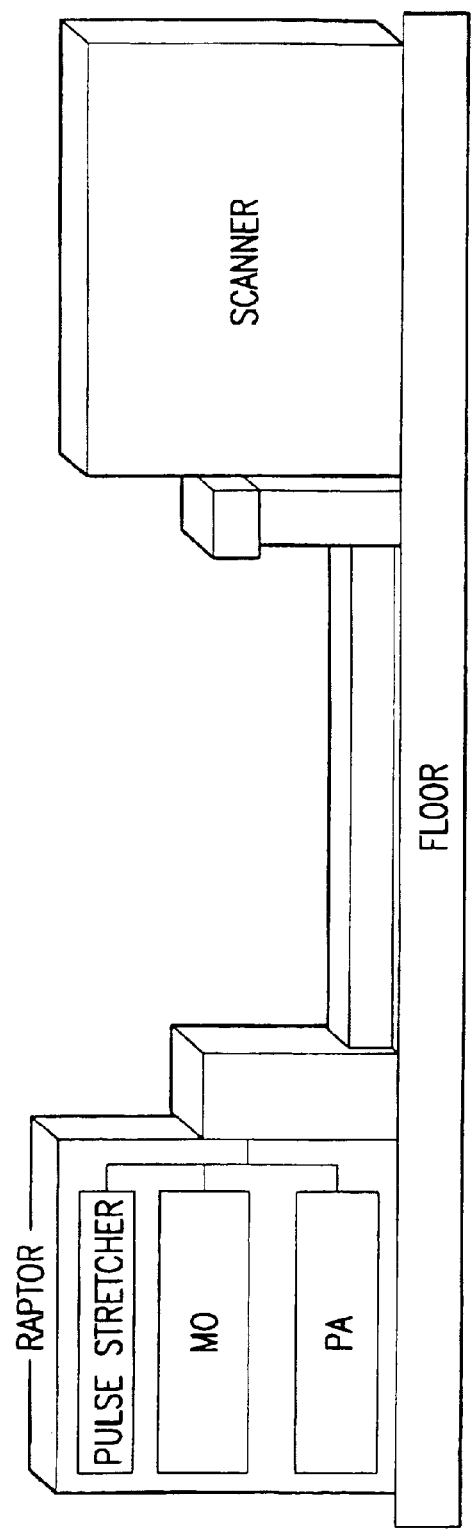
Figure 4C:
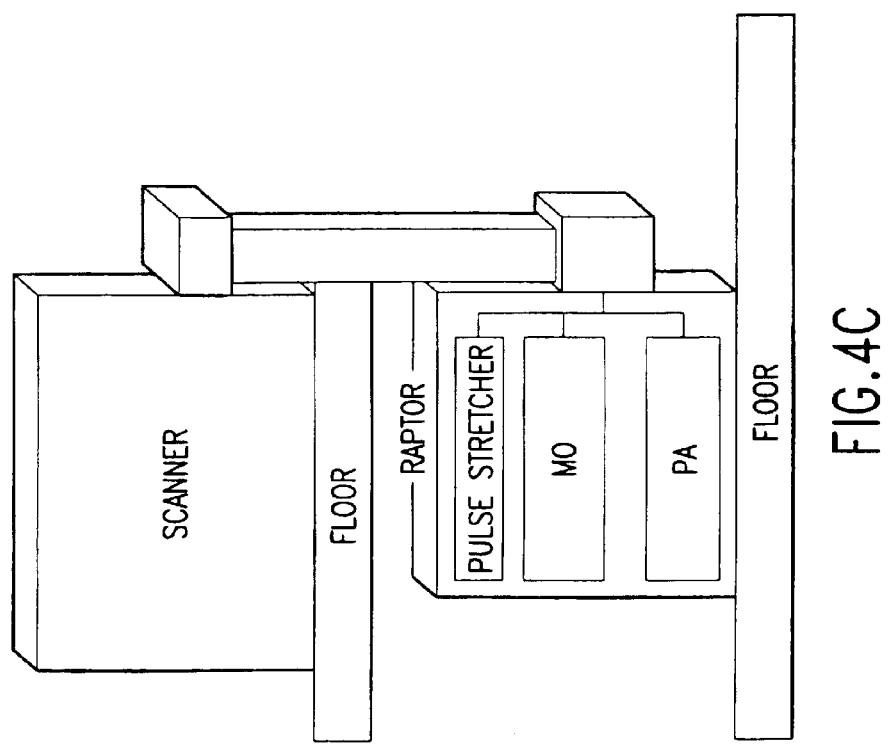

When using dielectric coated mirrors at 45 degrees for beam turning, it is important to take into consideration polarization effects because with these mirrors S-polarization is reflected nearly 97 percent whereas P-polarization is reflected only 90 to 92 percent. (P-polarization refers to the electric field component of the light which is in the plane defined by the beam direction and a line perpendicular to the optical surface at the intersection of the beam direction and the surface. S-Polarization refers to the direction of the electric components of the light in the plane of the surface and perpendicular to the P-polarization). Therefore, to maximize reflection from turning mirrors, it is important that the S-polarization direction corresponds to the polarization of the incoming beam. As the reader will note mirrors 40A and 40B are both oriented so that the S-polarization direction is horizontal corresponding to the electric field direction of about 98 percent of the light in output beam 14C; therefore reflection should be about 97 percent from these mirrors. The mirror shown in the BDU shown in FIGS. 4A, 4B and 4C are all properly oriented from maximum reflection of horizontally polarized light. However, the mirror shown at 52 in FIG. 4.D is oriented so that the P-polarization direction is in the direction of the electric field direction of 98 percent of the light in the beam so that reflection by this mirror would be only about 90 to 92 percent. In this case Applicants preferred solution is to utilize two prisms to make the 90-degree beam turn at the 50 location in FIG. 4D. This technique is shown in FIG. 5. Two prisms 52 and 54 with an apex angle of 67.2-degrees (the angle is important) can change the angle of incidence by 90 degrees for the s-polarized light. The beam enters and exits the prism at Brewster angle, so there is no reflection at all of light in the horizontal direction. The portion of the beam polarized in the vertical direction would be mostly reflected by the first prism. The layout is done for 193 nm and CaF2 prisms. (Minor modifications would be needed for 248 nm or 157 nm). Since no coatings are involved, the lifetime of this assembly is very high.

Figure 6:
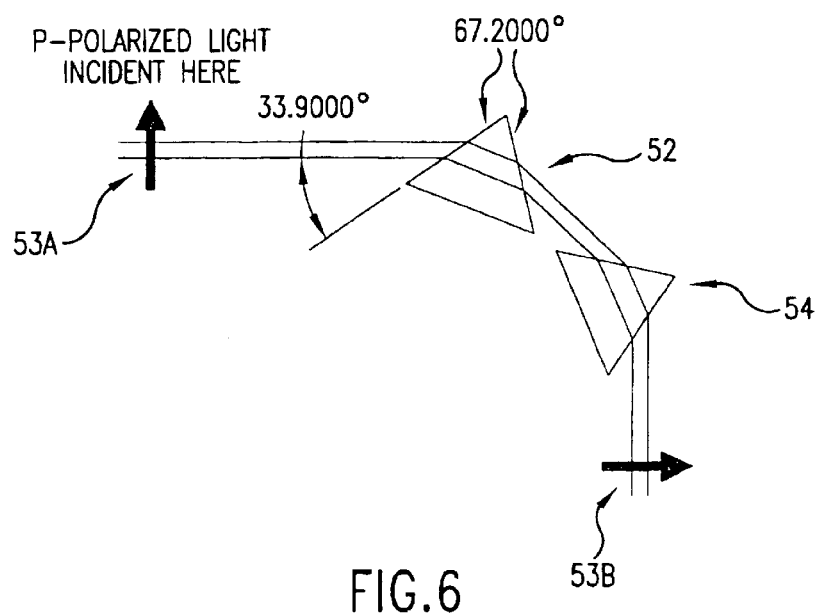
FIG. 6 shows a technique of tuning a beam 90 degrees with prisms.
Figure 7:
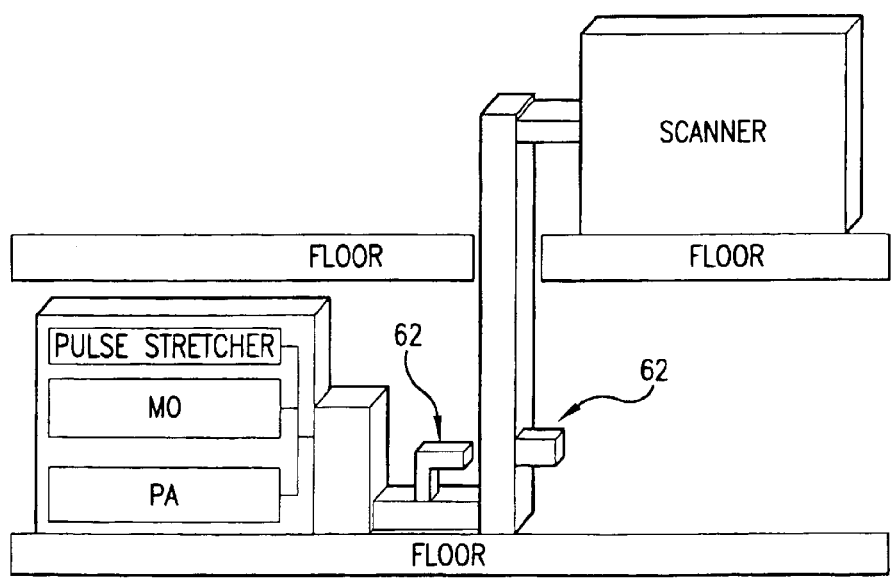
FIG. 7 shows a laser light source with beam delivery to a scanner.

As the horizontal polarized light passes through the two prisms at location 50 in FIG. 4D the direction of polarization of substantially all of the electric field components is reoriented from horizontal to vertical as indicated by arrows 53A and 53B as shown in FIG. 6. For this reason at mirror 56 the electric field components of the beam are substantially all vertical so that mirror 56 mounted vertically provides an s-polarization orientation with respect to the beam and about 97 percent of the light is reflected by mirror 56.

Purge Shutters For Mirrors

The BDU volume could be large, as much as 200 liters and must be purged with high purity $N_2$. This purging process may take several hours to get to the fee ppm level of oxygen and other organics. During the first installation of the BDU to the scanner, this purge time is acceptable, but is considered very long during normal operation. Assume that a mirror, such as mirror 60 in FIG. 4A needs service. This may entail dismantling the mirror from BDU which could expose BDU to air. Hence, what could be a brief service procedure (replacing the mirror) turns into a very long purge procedure. To avoid substantial delays associated with a long purge period to restore the quality of the beam path in the BDU, BDU shutter units 62 are added on both sides of each mirror in the BDU as shown in FIG. 6 for mirror 60. Here, in the BDU are located several inserts where service shutters may be inserted to isolate the other regions in a BDU. These shutters are normally not inserted during operation. For example, as shown in FIG. 6, two shutters are slid between mirror 60 that needs to be isolated and then the mirror itself is replaced. After that, this exposed region is now purged with $N_2$ for a few minutes. The purging interval is much shorter now due to the fact that the volume exposed to air is much smaller than the total volume of the BDU. Preferably during the servicing purging continues in all regions of the beam path other than that between the shutters.

Beam Path Purge

Figure 8:
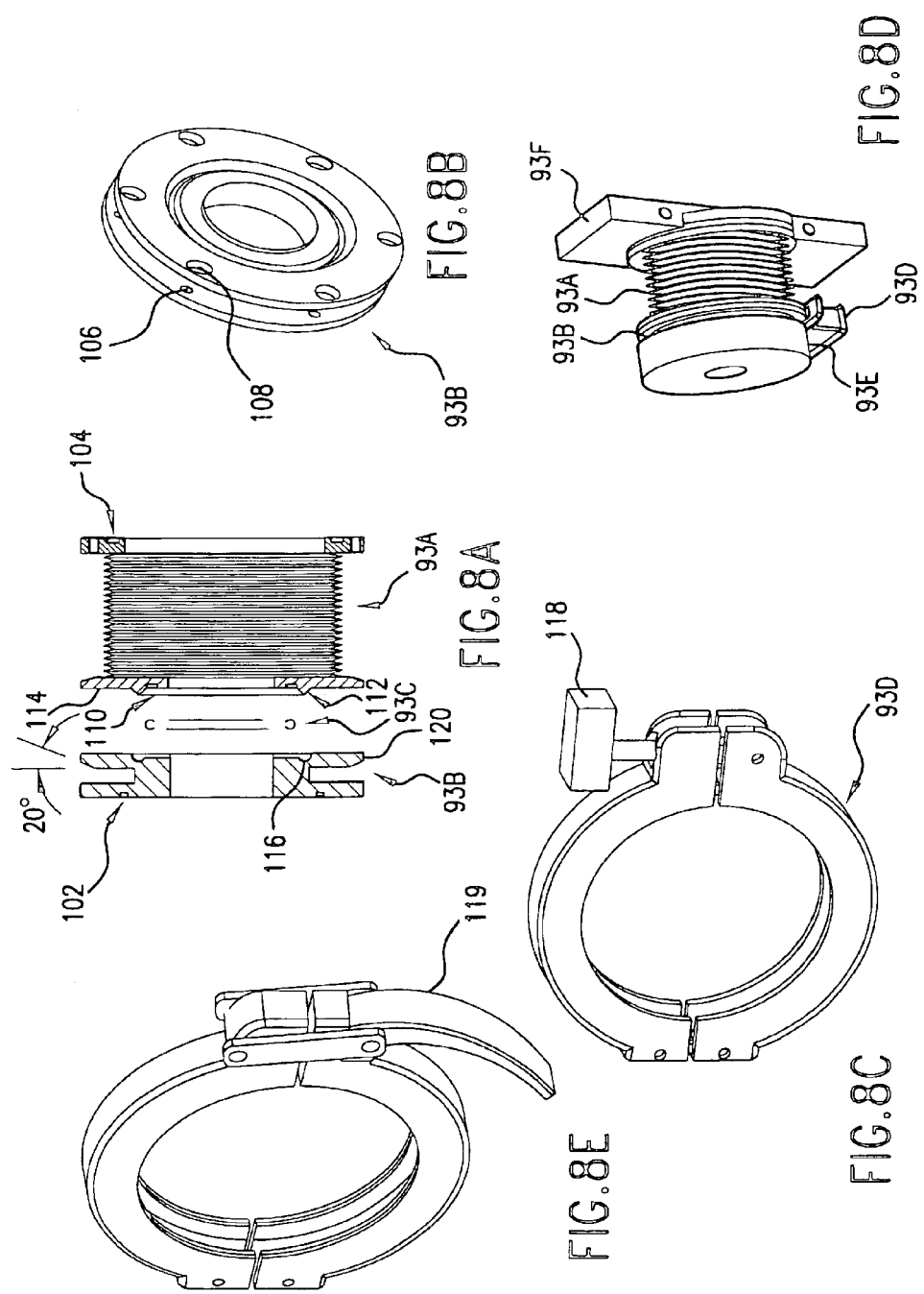
FIGS. 8A–8E show an easily sealing bellows seal.

In this preferred embodiment all portions of the beam path outside the laser chambers are purged with $N_2$, with two exceptions: (1) The line narrowing package and the portion of the path between laser chamber 8C and the LNP is purged with helium and (2) the etalon chambers in the LAM, SAM and BAM for measuring wavelength and bandwidth are sealed chambers. FIG. 1 shows a purge gas supply at 42 but the purge lines are not shown. Excellent examples of purged beam paths are described in detail in U.S. patent application Ser. No. 10/000,991 which is incorporated by reference herein. This technique includes metal bellows and easy sealing vacuum quality seals at interfaces between the vibrating chambers and the sensitive laser optics and vacuum quality seals at interface between all separate modules permitting quick separation of the modules to permit fast module removal for maintenance or for service. FIGS. 8A through E show drawings of preferred easy sealing bellows seals unit with parts 93A, B and C useful for making connection for components in the beam path from the LNP to the scanner. Either of the clamps shown in FIGS. 8C and 8E can be used to clamp parts 93A and 93B together with the tin coated metal C-seal sandwiched in between. FIG. 8D shows a cut-away of the assembled seal unit. The seals in the seal units are metal "C" seals preferably with a tin contact layer. The metal seals do not deteriorate or out gas contamination under ultraviolet irradiator.

Beam Path Monitor

Preferably monitors are provided to assure the quality of the laser beam path since contamination of the path with absorbers such as oxygen can substantially affect beam quality and pulse energy. Preferably several purge paths will be provided. Flow monitors can be used to monitor purge flow; however, other monitors may also be provided such as $O_2$ monitors which are commercially available from several suppliers. Another beam path quality monitors includes an acoustic monitor utilizing a electret electronic microphone available from suppliers such as Audio Products with offices in Dayton, Ohio. This type of monitor is described in U.S. patent application Ser. No. 10/000,991 which is incorporated by reference herein. In preferred embodiments these monitors are used to provide signals which may be used by the lithography operator to delay fabrication after a shutdown until the beam path purge has sufficiently cleared the beam path of contamination.

Beam Profile Flipping

For integrated circuit fabrication coherence of the laser beam is undesirable. Excimer laser beams characteristically have poor coherence which is one of the many reasons why this light source is good for integrated circuit fabrication. However, as other aspects of the beam quality continue to get better, even the poor coherence of the laser beams from these lasers may not be poor enough. If that turns out to be the case a coherence scrambler can be added. It could be added at several places in the beam path. A good place for it would be anywhere in the beam delivery unit.

Figure 9:
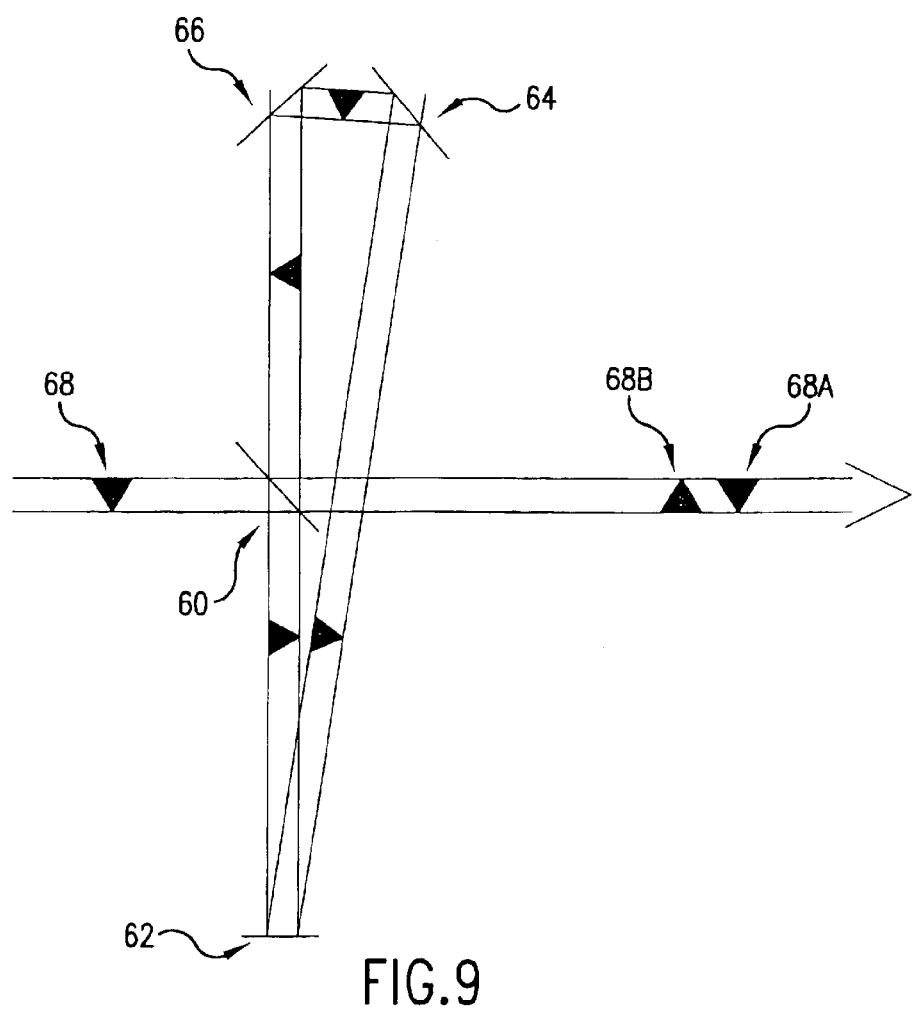
FIG. 9 demonstrates a feature of a preferred pulse stretcher.

FIG. 9 shows an example of a beam profile flipping coherence scrambler. This is produced with a 60 percent beam splitter 60 and three maximum reflection mirrors 62, 64, and 66. This arrangement segregates the pulse into segments in a manner similar to the pulse stretcher discussed above. But with this configuration the profile of each segment is flipped with respect to the preceding segment. In the FIG. 9 example the profile of the incoming pulse 68 is represented with a triangle with a point at the bottom. The first segment, 40% pulse intensity of the passes through with the same profile as shown at 68A. The reflected portion suffers reflection at each of the mirrors and 60 percent of it is reflected from beam splitter 60 that segment has a profile shown at 68B which is flipped with respect to profile 68A. As subsequent segments pass through the coherence scrambler their profiles are each flipped with respect to the preceding segment. Thus, the net profile of the beam will be scrambled and more importantly any coherence will also be scrambled. The reader should note that in this embodiment there will be no significant pulse stretching unless the legs are long enough to provide significant delays of the segments following the first one. Sine we have already stretch the pulse as described above the legs here could be very short such as a few inches in which case the segments will overlap each other.

Pulse Energy Detection at Wafer Plasma

In preferred embodiments of the present invention a pulse energy detector 44 is provided at wafer plane 46 in the scanner. Pulse energy signals this detector may be used in a feed back loop to control the energy output of the laser directly. Alternatively, the signals may be used for the purpose of determining pulse energy parameters as measured at the BAM or the SAM which will provide the illumination needed at the wafer plane.

Special $F_2$ Laser Features

The above descriptions generally apply directly to an ArF laser system but almost all of the features are equally applicable to KrF lasers with minor modifications which are well known in the industry. Some significant modifications are required, however, for the $F_2$ version of this invention. These changes could include a line selector in the place of the LNP and/or a line selector between the two chambers or even downstream of the power amplifier. Line selectors preferably are a family of prisms. Transparent plates properly oriented with respect to the beam could be used between the chambers to improve the polarization of the output beam. A diffuser could be added between the chambers to reduce the coherence of the output beam.

Various modifications may be made to the present invention without altering its scope. Those skilled in the art will recognize many other possible variations.

For example, although the invention, including the utilization of a beam delivery unit, is described using a MOPA laser configuration, a single chamber laser system such as described in U.S. Pat. No. 6,330,261 could be utilized. For lithography either ArF, KrF or $F_2$ systems could be utilized. This invention may also be applied to uses other than lithography in which other ultraviolet wavelength may be more appropriate. An important improvement here is the addition of equipment to a laser system to deliver an ultraviolet laser beam having desire beam qualities to an input port of equipment needing an ultraviolet laser light source. Various feedback control arrangements other than those referred to herein could be used.

Figure 10:
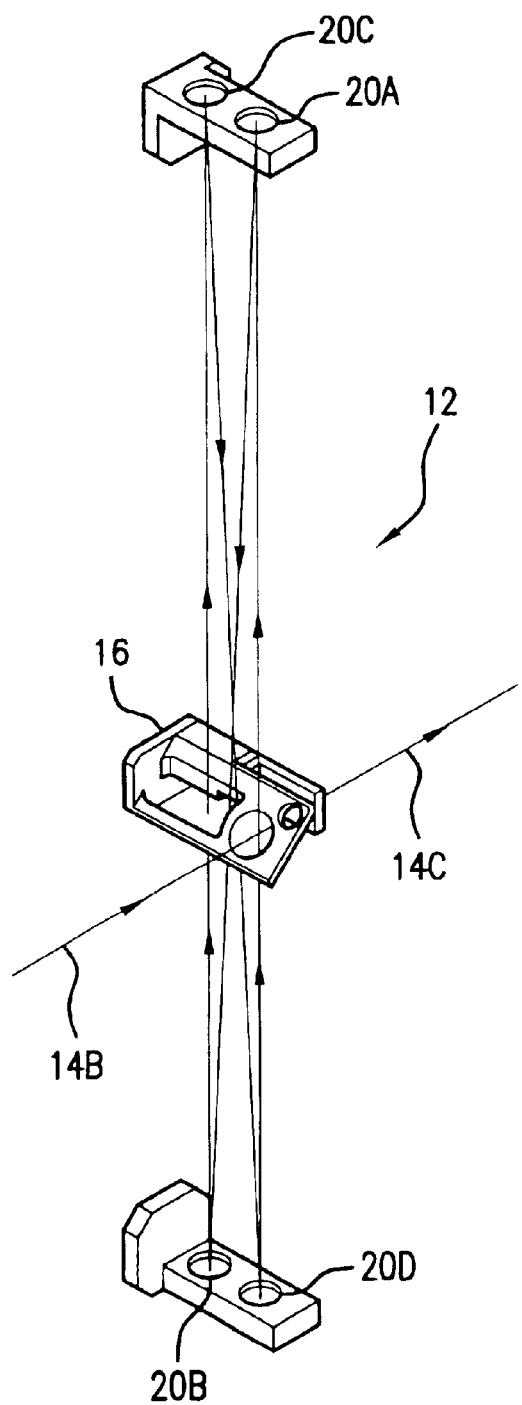
FIG. 10 shows an embodiment of the pulse stretcher of FIG. 2.

Turning now to FIG. 10 there is shown in more detail a pulse stretcher 12 as illustrated schematically in FIG. 2. The pulse stretcher may include, e.g., a bean splitter 16 as is well known in the art and a pair of upper mirrors 20A and 20C and a pair of lower mirrors 20B and 20D. It will be understood that the terms upper and lower are meant to refer to the orientation of the illustrative embodiment as shown in FIG. 10, and indeed the mirrors can be so oriented in the apparatus of the present invention as installed, and this may also correspond to a vertical axis aligned to true vertical. However, the axis need not necessarily be aligned to true vertical, though most often it is, and further the axis may be rotated approximately to the horizontal axis and may be aligned to true horizontal and most often, if so rotated, would be. But the rotated axis need not be aligned to true horizontal. In the latter embodiment the beam splitter 16 would be rotated 90° around the axis of the laser output light pulse beam 14B, 14C.

In the embodiment shown in FIG. 10, it will be noted that the portion of the laser output light pulse beam within the optical delay path formed by the mirrors 20A–D is traversing the optical delay path in generally the same plane, aligned generally orthogonal to the path of the laser output light pulse beam 14B, 14C.

Figure 11:
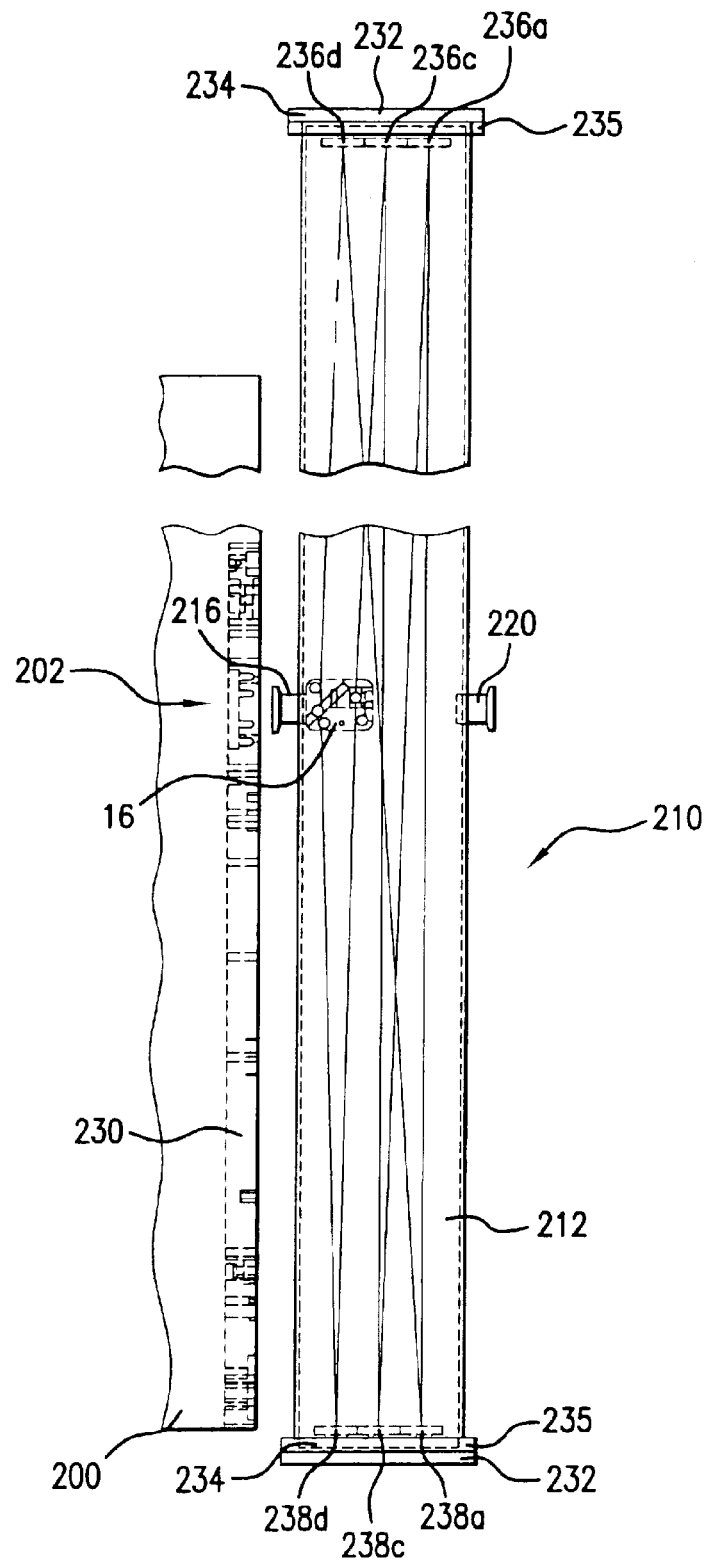
FIG. 11 shows a side view of an example of an external pulse stretcher according to an embodiment of the present invention.
Figure 12:
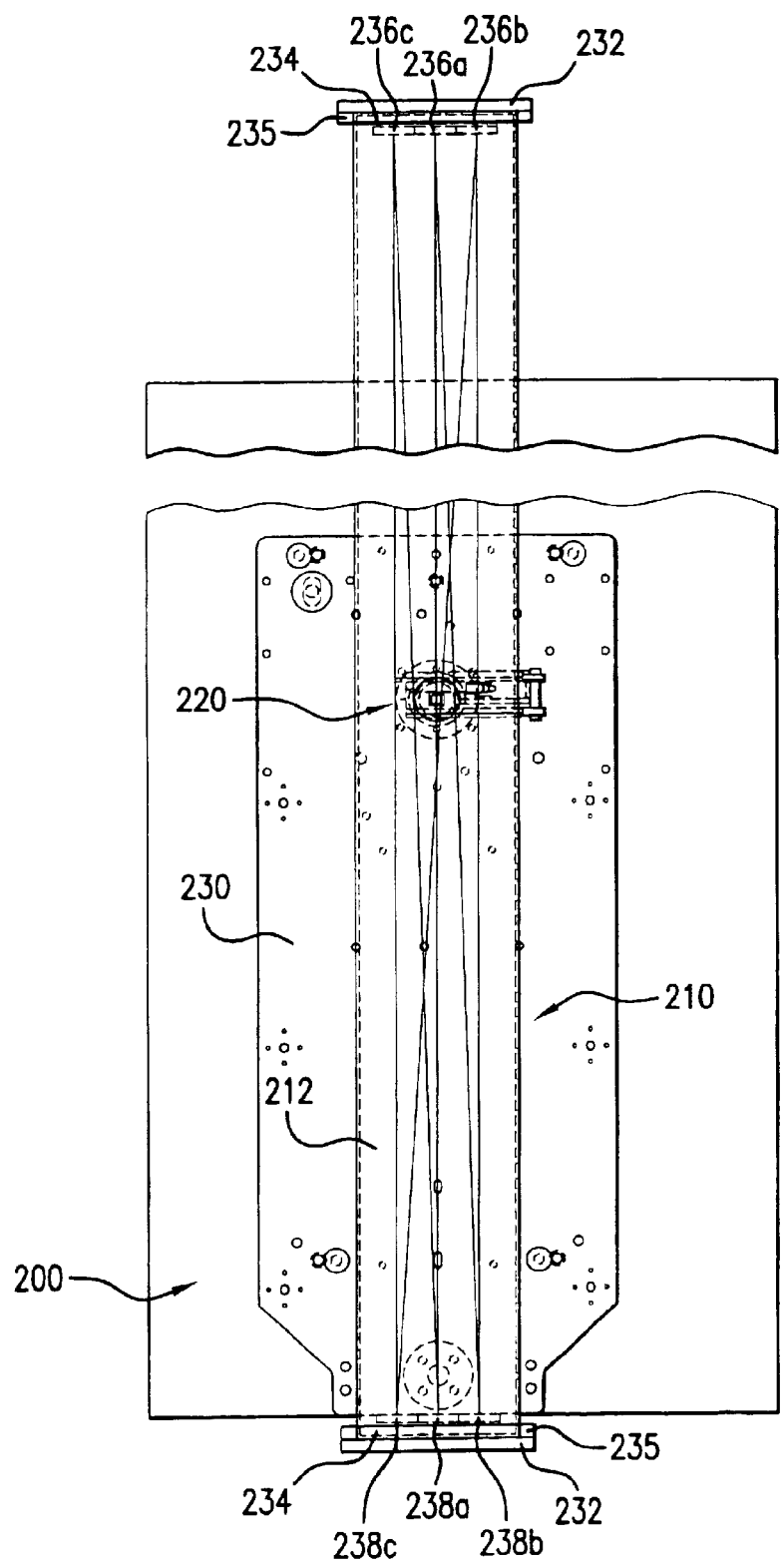
FIG. 12 shows a front view of an example of an external pulse stretcher according to an embodiment of the present invention.

Turning now to FIGS. 11 and 12, there is shown a side view of an external pulse stretcher 210 according to an embodiment of the present invention. The external pulse stretcher 210 may include, e.g., a housing 212. The housing 212 may be of any shape, however, applicants have found that a cylindrical shape is preferable to, e.g., a rectilinear shape, since the vibrational resonance points for an elongated cylinder, such as housing 212, are shifted towards higher frequencies and also by over a factor of 2, which can be very desirable.

Figure 13:
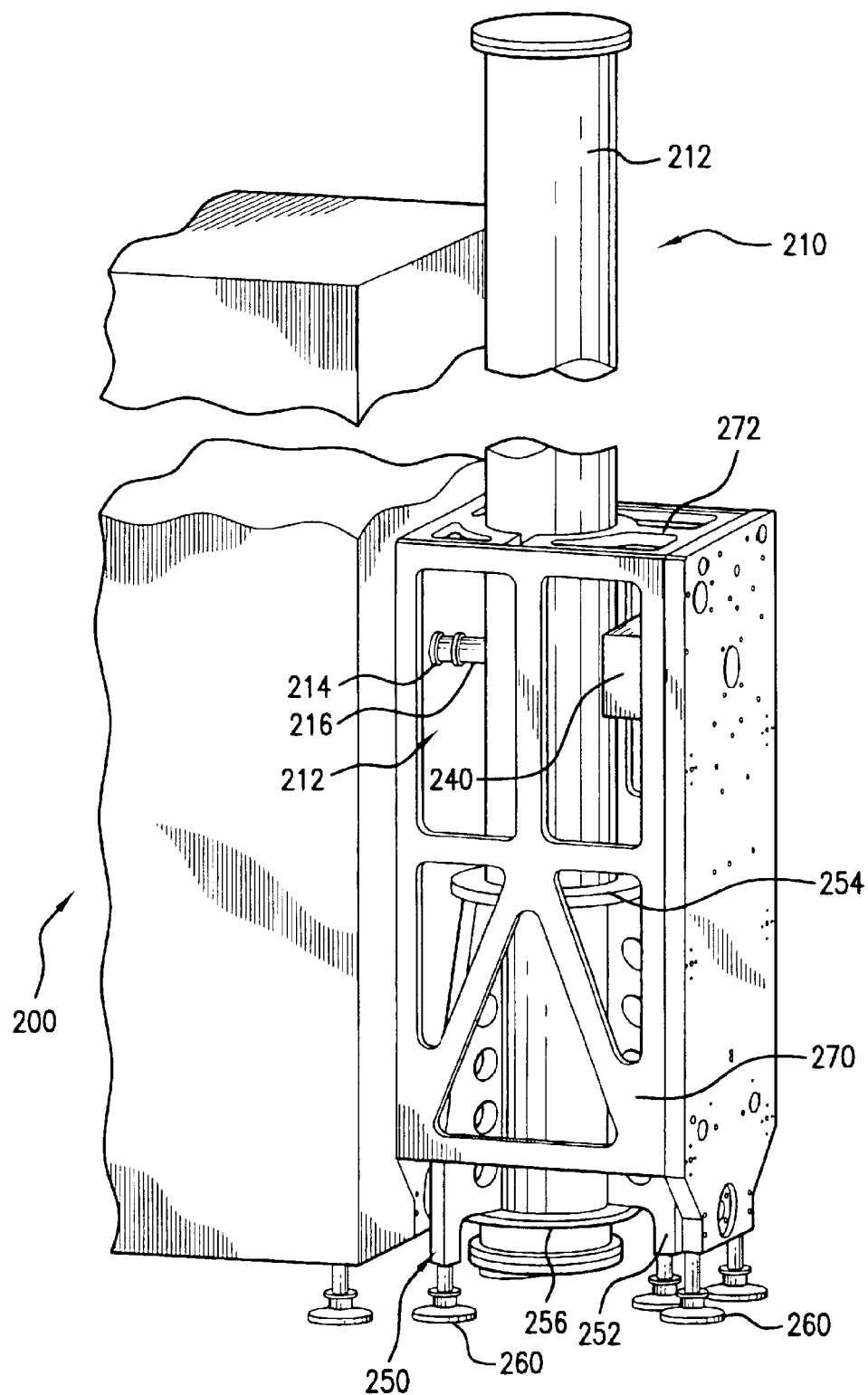
FIG. 13 shows a perspective view of and example of the external pulse stretcher shown in FIGS. 11 and 12 according to an embodiment of the present invention.

The housing 212 may have, e.g., an external pulse stretcher input coupling 216, which may be connected to a laser output 202, which may be the output of an OPUS 22, as described above, and may also be connected to the output 202 by a bellows connection 214, similar to those described above, as shown, e.g., in FIG. 13. The input 216 may be optically aligned with the beam splitter 16, as shown in FIGS. 11 and 12 and with an external pulse stretcher output coupling, which may have a bellows connector (not shown) similar to bellows connector 214 shown in FIG. 13, to connect the output 220 to a user interface plats 230, shown in FIGS. 12 and 13.

The user interface plate 230 shown in FIG. 13, and connected to the external pulse stretcher output 220, may be essentially identical to interface plate 230 one shown in FIGS. 11 and 12 connected to the laser system 200 housing within the frame (not shown) of the laser system 200. The user interface plate is shown with a myriad of holes (not labeled) since it is a universal user interface plate with the capability of being attached to user interface plates r other connection apparatus on the laser light micro-lithography systems of a plurality of customers.

Each end of the housing 212 is sealed by an end plate 232, which may be attached to a flange 235 formed on the respective end of the housing 210. A mirror mounting plate 236 may be mounted on each respective end plate 232. Mounted on the respective mounting plates 234 may be a respective group of optical delay path mirrors 236a–d on the upper mounting plate 234 and 238a–c on the lower mounting plate 234. The mirrors in the embodiment of the present invention illustrated in FIGS. 11 and 12, may be arranged in a preselected pattern, e.g., symmetrically arranged around the longitudinal axis of the housing 212, which ordinarily, in the alignment shown in FIGS. 11 and 12, may align with the true vertical axis.

Each of the mirrors 236a–d and 238a–d may be optically focusing mirrors having a radius of curvature equal to the distance between the mirror and the next and preceding mirrors in the optical delay path explained in more detail below. The arrangement of the mirrors 236a–d and 238a–d, according to an embodiment of the present invention illustrated in FIGS. 11 and 12 means that the beam path between any two mirrors within the groups of mirrors 236a–d and 238a–d may change the beam path in either one or two planes. In addition all of the reflections, except the first and last, as explained in more detail below may be displaced out of the plane in which the pulse stretcher optical path lies in the pulse stretcher of FIG. 2. This is further illustrated with respect to FIGS. 14a–c. The axis of symmetry for the arrangement of the mirrors 236a–d and 238a–d according to the embodiment of the present invention illustrated in FIGS. 11, 12 and 14a–c, may be coextensive with the longitudinal axis of the housing 212. The centers of the mirrors may be laid out in a square pattern, with the mirror pattern capable of being subscribed in a circle.

The beam path within the optical delay line of the embodiment of the present invention illustrated may be seen from FIGS. 11 and 12, it being understood that in the side view of FIG. 11 and the front view of FIG. 12, only three of the mirrors 236a–d and 238a–d may be seen, and for simplicity sake, the beam paths to the unseen mirrors (236b and 238b in FIG. 11 and 236c and 238c in FIG. 12) are also not shown Referring to FIGS. 11 and 12 there are illustrated as examples two different optical delay paths, which may be implemented, e.g., depending on whether the beam splitter 16 is placed closer to the input 216, with, e.g., the metrology unit 240, e.g., as shown in FIG. 13, between the beam splitter 16 and the output 220, or is placed closer to the output 220, with the metrology unit 240 between the beam splitter 16 and the input 216. As can be seen from FIGS. 11 and 12 and 14a–c, the mirrors 236a–d and 238a–d may be arranged so that three are visible from the side or front. In such an arrangement, at least two of the mirrors 236a–d and 238a–d are displaced from the plane of the delayed beam as it is first reflected into the optical delay path by the beam splitter 16. It will be understood that by, e.g., rotating the mounting plates 234, e.g., by 90° four of the mirrors 236a–d and 238a–d will be in essentially the positions of the mirrors FIG. 10, but at least two others of the mirrors 236a–d and 238a–d will be displaced out of the plane of the delay path shown in, e.g., FIG. 10 and, further, the sequence of reflections may be changed from that shown in FIG. 10, e.g., such that only the reflections to and from the beam splitter remain in the plane of the optical delay illustrated in FIG. 10.

Figure 16:
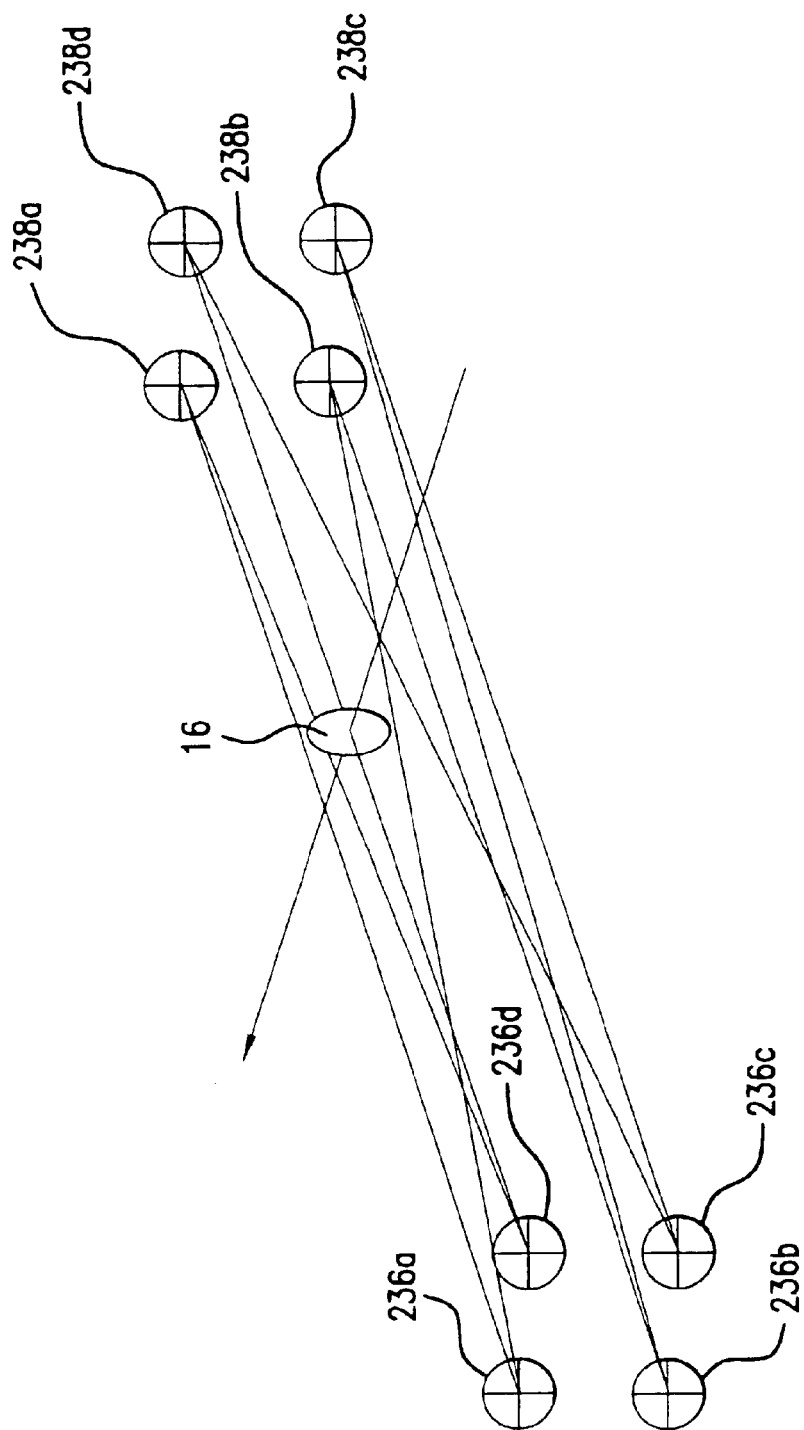
FIG. 16 shows an illustrative optical delay path according to an embodiment of the present invention.

In the path illustrated in FIG. 16, a portion, e.g. 61% of the laser output light pulse beam is reflected by the beam splitter 16 onto the mirror 236d while, e.g., 35% is passed through to the output path. From the mirror 336d the beam in the delay path is reflected to the mirror 238a and then to the mirror 236a and so-forth until the pulse is reflected onto the opposite side of the beam splitter 16 by mirror 238d where, e.g., 61% is reflected into the output path.

Turning now to FIG. 13, there is shown an attachment mechanism for attaching the external pulse stretcher 210 to the laser system 200 frame/housing, shown schematically as the box 200. The housing 212 is shown connected to a vertical support stanchion 250, which may have an upper collar 254 and a lower collar 256 into which the housing 212 fits. The stanchion has a plurality of legs 252 which have attached to them leveling feet 260 similar to those currently used by applicants' employer for leveling laser systems in the field, as are well known in the art. Gussets 270 having supporting and strengthening cross pieces may be attached to and between the user interface plate 230 on the laser system 200 and on the output of the external pulse stretcher 210. horizontal gussets 272 may be attached between and to the plates 230 and/or the vertical gussets 270 and serve to engage the housing 210 and prevent its movement and also (not shown) to engage the legs 252 of the stanchion 250 as well as the housing 210 at the lower end of the vertical gussets 270. Further bracketing/gusseting may be employed along the expanse of the laser system 200 frame above the upper horizontal gusset 272 shown in FIG. 13.

Figure 15:
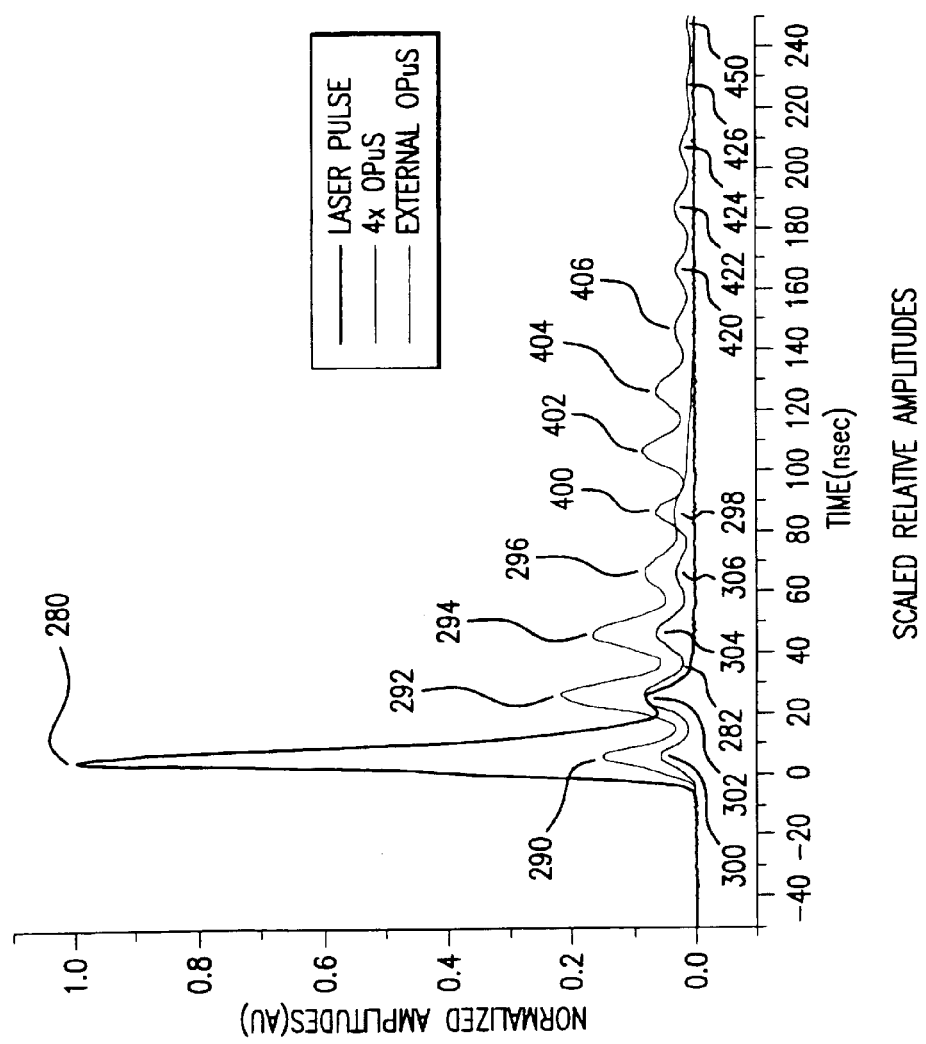
FIG. 15 illustrates the development of a 200 ns or above TIS stretched pulse for laser micro-lithography and like uses according to an embodiment of the present invention.

A further exemplary optical delay path is illustrated in FIG. 15. In FIG. 15 is shown a single very narrow band laser output light pulse 280, along with a much attenuated pulse 282 and the result of the passage of the pulses 280 and 282 through a 4× optical pulse stretcher, i.e., 290, 292, 294 and 296 and some attenuated trailing pulses 298. Finally, the passage of the output pulse 290, 292, 294 and 296 from the 4× pulse stretcher result in respectively pulses 300, 302, 304 and 306, as each of the pulses 290, 292, 294 and 296 passes through the beam splitter 16 as shown in FIGS. 11 and 12, and in respectively pulses 400, 402, 404 and 406, as each of the respective pulses 290, 292, 294 and 296 complete a first pas through the optical delay path of the external pulse stretcher 210, and subsequently pulses 420, 422, 424 and 426, as the respective pulses 290, 292, 294 and 296 make a second pass through the optical delay path of the external pulse stretcher 210, and finally the last group of pulses 450 are similarly created. All of these pulses can be integrated over time to arrive at the TIS value, which in the illustrated case of an eight foot focal length for the mirrors 236a–d and 238a–d, is over 200 ns.

This assumes a certain nominal pulse length of the laser output light pulse beam of, e.g., 20 ns, which may vary with certain conditions, since the pulse stretchers are pulse length multipliers and the output is determined by the input being multiplied.

It will be understood that the above described invention may take other forms and variations without departing from the scope and intent of the present invention. For example, while shown attached to the front of the laser system, at the expense of some slightly more complex, and therefore expensive, optics the external beam expander may be attached in a different orientation to the laser system 200 frame (not shown) while still taking advantage of the opportunities for better and more long-lasting alignment afforded by attachment to the frame of the laser system. It will be also understood that the pulse stretcher according to the illustrated embodiment of the present invention need not be "external" at all, and, e.g., the frame and any housing associated with the frame may be extended to also enclose the pulse stretcher 210. Similarly, the pulse stretcher may be contained in a beam delivery unit, e.g., in a horizontal or vertical section thereof, or in a section that is neither in the horizontal of vertical plane, if appropriate. This may require further alignment techniques not available from attachment to the laser system frame and may also require dynamic adjustments to, e.g., beam pointing and beam direction and for the optical delay line mirrors, etc. In addition, further pulse stretching could be accomplished, e.g., if the laser output light pulse beam were increased in output energy, e.g., by adding another pulse stretcher before the first stretcher or by an additional mirror or mirrors to the illustrated groups of four mirrors in the illustrated external pulse stretcher. However, the invention contemplates such embodiment as just described.

Accordingly, the above disclosure is not intended to be limiting and the scope of the invention should be determined by the appended claims and their legal equivalents.

We claim:

1. A laser light pulse stretching unit comprising:

a beam splitter in the path of a laser output light pulse beam;

the beam splitter selected to pass a first percent of the energy of a first input pulse of the laser output light pulse beam along a laser output light pulse beam output path as a first output pulse and to reflect a second percent of the energy of the laser output light pulse beam into a first delayed beam;

an optical delay path receiving the first delayed beam and returning the first delayed beam to the beam splitter in an orientation such that a third percent of the first delayed beam is reflected into the output path as a second output pulse and a fourth percent is passed into the optical delay path as a second delayed beam;

the optical delay path receiving the second delayed beam and returning the second delayed beam to the beam splitter in an orientation such that the third percent of the second delayed beam is reflected into the output path as a third output pulse and the fourth percent of the second delayed beam is passed into the optical delay path as a third delayed beam;

the optical delay path receiving the third delayed beam and returning the third delayed beam to the beam splitter in an orientation such that the third percent of the third delayed beam is reflected into the output path as a fourth output pulse;

the first input pulse being a first pulse in a plurality of pulses output from a prior pulse stretcher, each of a plurality of succeeding input pulses comprising the output of the prior pulse stretcher resulting from the stretching of a narrow band laser light output pulse, forming successive first, second, third and fourth output pulses, the combination of which forms a pulse stretcher having an output with a TIS of at least 200 ns.

2. The apparatus of claim 1 further comprising:

the optical delay path being formed of a plurality of at least eight reflecting mirrors.

3. The apparatus of claim 2 further comprising:

the optical delay path being contained in an elongated enclosure having a first end and a second end;

a first end plate at the first end and a second end plate at the second end;

the first end plate having a first mounting surface within the enclosure and the second end plate having a second mounting surface within the enclosure;

a first group of at least four of the at least eight reflecting mirrors mounted on the first mounting surface symmetrically about a center axis of the optical delay path and a second group of at least four of the at least eight reflecting mirrors mounted on the second mounting surface symmetrically about the center axis.

4. The apparatus of claim 2 further comprising:
the plurality of mirrors form a first group and a second group, each of the first group and second group being staggered in a predefined pattern.

5. The apparatus of claim 3 further comprising:
each of the first group and the second group are staggered in a selected pattern.

6. The apparatus of claim 4 further comprising:
the pattern can be circumscribed by a circle.

7. The apparatus of claim 5 further comprising:
the pattern can be circumscribed by a circle.

8. The apparatus of claim 4 further comprising:
the reflections of the first delayed beam, the second delayed beam and the third delayed beam, between a mirror in one of the first and second groups to a mirror in the other of the first and second groups, as relates to a selected axis of the beam, the beam paths lie in a plurality of planes.

9. The apparatus of claim 5 further comprising:
the reflections of the first delayed beam, the second delayed beam and the third delayed beam, between a mirror in one of the first and second groups to a mirror in the other of the first and second groups, as relates to a selected axis of the beam, the beam paths lie in a plurality of planes.

10. The apparatus of claim 6 further comprising:
the reflections of the first delayed beam, the second delayed beam and the third delayed beam, between a mirror in one of the first and second groups to a mirror in the other of the first and second groups, as relates to a selected axis of the beam, the beam paths lie in a plurality of planes.

11. The apparatus of claim 7 further comprising:
the reflections of the first delayed beam, the second delayed beam and the third delayed beam, between a mirror in one of the first and second groups to a mirror in the other of the first and second groups, as relates to a selected axis of the beam, the beam paths lie in a plurality of planes.

12. A pulse stretcher for increasing the TIS of a narrow band output pulse of a laser output light pulse beam comprising:
a beam splitter in the path of the laser output light pulse beam, splitting the laser output light pulse beam into an output beam and a delayed beam;
an optical delay path receiving the delayed beam, the optical delay path comprising:
a first group of at least four mirrors, at least two of which are displaced out of the plane of the delayed beam as it is reflected from the beam splitter;
a second group of at least four mirrors, at least two of which are displaced out of the plane of the delayed beam as it is reflected from the beam splitter;
a first mounting plate containing the first group of mirrors arranged in a symmetrical pattern about a centerline axis of the first mounting plate; and,
a second mounting plate containing the first group of mirrors arranged in a symmetrical pattern about a centerline axis of the second mounting plate.

13. The apparatus of claim 12 further comprising:
the pulse stretcher is contained within an elongated housing.

14. The apparatus of claim 13 further comprising:
the elongated housing is cylindrical.

15. The apparatus of claim 12 further comprising:
the paths of the delayed beam within the optical delay path of the pulse stretcher are all out of the plane of the delayed bean as it is reflected by the beam splitter into the optical delay path with the exception of the delayed beam as it is reflected back to the beam splitter.

16. The apparatus of claim 13 further comprising:
the paths of the delayed beam within the optical delay path of the pulse stretcher are all out of the plane of the delayed bean as it is reflected by the beam splitter into the optical delay path with the exception of the delayed beam as it is reflected back to the beam splitter.

17. The apparatus of claim 14 further comprising:
the paths of the delayed beam within the optical delay path of the pulse stretcher are all out of the plane of the delayed bean as it is reflected by the beam splitter into the optical delay path with the exception of the delayed beam as it is reflected back to the beam splitter.

18. A laser producing a narrow band laser output light pulse beam for use in micro-lithography illumination, comprising:
a laser light pulse stretching unit comprising:
a beam splitter in the path of a laser output light pulse beam;
the beam splitter selected to pass a first percent of the energy of a first input pulse of the laser output light pulse beam along a laser output light pulse beam output path as a first output pulse and to reflect a second percent of the energy of the laser output light pulse beam into a first delayed beam;
an optical delay path receiving the first delayed beam and returning the first delayed beam to the beam splitter in an orientation such that a third percent of the first delayed beam is reflected into the output path as a second output pulse and a fourth percent is passed into the optical delay path as a second delayed beam;
the optical delay path receiving the second delayed beam and returning the second delayed beam to the beam splitter in an orientation such that the third percent of the second delayed beam is reflected into the output path as a third output pulse and the fourth percent of the second delayed beam is passed into the optical delay path as a third delayed beam;
the optical delay path receiving the third delayed beam and returning the third delayed beam to the beam splitter in an orientation such that the third percent of the third delayed beam is reflected into the output path as a fourth output pulse;
the first input pulse being a first pulse in a plurality of pulses output from a prior pulse stretcher, each of a plurality of succeeding input pulses comprising the output of the prior pulse stretcher resulting from the stretching of a narrow band laser light output pulse, forming successive first, second, third and fourth output pulses, the combination of which forms a pulse stretcher having an output with a TIS of at least 200 ns.

19. The apparatus of claim 18 further comprising:
the optical delay path being formed of a plurality of at least eight reflecting mirrors.

20. The apparatus of claim 19 further comprising:
the optical delay path being contained in an elongated enclosure having a first end and a second end;

a first end plate at the first end and a second end plate at the second end;
the first end plate having a first mounting surface within the enclosure and the second end plate having a second mounting surface within the enclosure;
a first group of at least four of the at least eight reflecting mirrors mounted on the first mounting surface symmetrically about a center axis of the optical delay path and a second group of at least four of the at least eight reflecting mirrors mounted on the second mounting surface symmetrically about the center axis.

21. The apparatus of claim 19 further comprising:
the plurality of mirrors form a first group and a second group, each of the first group and second group being staggered in a predefined pattern.

22. The apparatus of claim 20 further comprising:
each of the first group and the second group are staggered in a selected pattern.

23. The apparatus of claim 21 further comprising:
the pattern can be circumscribed by a circle.

24. The apparatus of claim 22 further comprising:
the pattern can be circumscribed by a circle.

25. The apparatus of claim 21 further comprising:
the reflections of the first delayed beam, the second delayed beam and the third delayed beam, between a mirror in one of the first and second groups to a mirror in the other of the first and second groups, as relates to a selected axis of the beam, the beam paths lie in a plurality of planes.

26. The apparatus of claim 22 further comprising:
the reflections of the first delayed beam, the second delayed beam and the third delayed beam, between a mirror in one of the first and second groups to a mirror in the other of the first and second groups, as relates to a selected axis of the beam, the beam paths lie in a plurality of planes.

27. The apparatus of claim 23 further comprising:
the reflections of the first delayed beam, the second delayed beam and the third delayed beam, between a mirror in one of the first and second groups to a mirror in the other of the first and second groups, as relates to a selected axis of the beam, the beam paths lie in a plurality of planes.

28. The apparatus of claim 24 further comprising:
the reflections of the first delayed beam, the second delayed beam and the third delayed beam, between a mirror in one of the first and second groups to a mirror in the other of the first and second groups, as relates to a selected axis of the beam, the beam paths lie in a plurality of planes.

29. A pulse stretcher for increasing the TIS of a narrow band output pulse of a laser output light pulse beam comprising:
a beam splitter in the path of the laser output light pulse beam, splitting the laser output light pulse beam into an output beam and a delayed beam;
an optical delay path receiving the delayed beam, the optical delay path comprising:
a first group of at least four mirrors, at least two of which are displaced out of the plane of the delayed beam as it is reflected from the beam splitter;
a second group of at least four mirrors, at least two of which are displaced out of the plane of the delayed beam as it is reflected from the beam splitter;
a first mounting plate containing the first group of mirrors arranged in a symmetrical pattern about a centerline axis of the first mounting plate; and,
a second mounting plate containing the first group of mirrors arranged in a symmetrical pattern about a centerline axis of the second mounting plate.

30. The apparatus of claim 29 further comprising:
the pulse stretcher is contained within an elongated housing.

31. The apparatus of claim 30 further comprising:
the elongated housing is cylindrical.

32. The apparatus of claim 29 further comprising:
the paths of the delayed beam within the optical delay path of the pulse stretcher are all out of the plane of the delayed bean as it is reflected by the beam splitter into the optical delay path with the exception of the delayed beam as it is reflected back to the beam splitter.

33. The apparatus of claim 30 further comprising:
the paths of the delayed beam within the optical delay path of the pulse stretcher are all out of the plane of the delayed bean as it is reflected by the beam splitter into the optical delay path with the exception of the delayed beam as it is reflected back to the beam splitter.

34. The apparatus of claim 31 further comprising:
the paths of the delayed beam within the optical delay path of the pulse stretcher are all out of the plane of the delayed bean as it is reflected by the beam splitter into the optical delay path with the exception of the delayed beam as it is reflected back to the beam splitter.

35. A beam delivery unit for delivering a laser output light pulse beam from a narrow band laser system output to the input of a micro-lithography tool, comprising:
a laser light pulse stretching unit comprising:
a beam splitter in the path of a laser output light pulse beam;
the beam splitter selected to pass a first percent of the energy of a first input pulse of the laser output light pulse beam along a laser output light pulse beam output path as a first output pulse and to reflect a second percent of the energy of the laser output light pulse beam into a first delayed beam;
an optical delay path receiving the first delayed beam and returning the first delayed beam to the beam splitter in an orientation such that a third percent of the first delayed beam is reflected into the output path as a second output pulse and a fourth percent is passed into the optical delay path as a second delayed beam;
the optical delay path receiving the second delayed beam and returning the second delayed beam to the beam splitter in an orientation such that the third percent of the second delayed beam is reflected into the output path as a third output pulse and the fourth percent of the second delayed beam is passed into the optical delay path as a third delayed beam;
the optical delay path receiving the third delayed beam and returning the third delayed beam to the beam splitter in an orientation such that the third percent of the third delayed beam is reflected into the output path as a fourth output pulse;
the first input pulse being a first pulse in a plurality of pulses output from a prior pulse stretcher, each of a plurality of succeeding input pulses comprising the output of the prior pulse stretcher resulting from the stretching of a narrow band laser light output pulse, forming successive first, second, third and fourth output pulses, the combination of which forms a pulse stretcher having an output with a TIS of at least 200 ns.

36. The apparatus of claim 35 further comprising:
the optical delay path being formed of a plurality of at least eight reflecting mirrors.

37. The apparatus of claim 36 further comprising:
the optical delay path being contained in an elongated enclosure having a first end and a second end;
a first end plate at the first end and a second end plate at the second end;
the first end plate having a first mounting surface within the enclosure and the second end plate having a second mounting surface within the enclosure;
a first group of at least four of the at least eight reflecting mirrors mounted on the first mounting surface symmetrically about a center axis of the optical delay path and a second group of at least four of the at least eight reflecting mirrors mounted on the second mounting surface symmetrically about the center axis.

38. The apparatus of claim 36 further comprising:
the plurality of mirrors form a first group and a second group, each of the first group and second group being staggered in a predefined pattern.

39. The apparatus of claim 37 further comprising:
each of the first group and the second group are staggered in a selected pattern.

40. The apparatus of claim 38 further comprising:
the pattern can be circumscribed by a circle.

41. The apparatus of claim 39 further comprising:
the pattern can be circumscribed by a circle.

42. The apparatus of claim 38 further comprising:
the reflections of the first delayed beam, the second delayed beam and the third delayed beam, between a mirror in one of the first and second groups to a mirror in the other of the first and second groups, as relates to a selected axis of the beam, the beam paths lie in a plurality of planes.

43. The apparatus of claim 39 further comprising:
the reflections of the first delayed beam, the second delayed beam and the third delayed beam, between a mirror in one of the first and second groups to a mirror in the other of the first and second groups, as relates to a selected axis of the beam, the beam paths lie in a plurality of planes.

44. The apparatus of claim 40 further comprising:
the reflections of the first delayed beam, the second delayed beam and the third delayed beam, between a mirror in one of the first and second groups to a mirror in the other of the first and second groups, as relates to a selected axis of the beam, the beam paths lie in a plurality of planes.

45. The apparatus of claim 41 further comprising:
the reflections of the first delayed beam, the second delayed beam and the third delayed beam, between a mirror in one of the first and second groups to a mirror in the other of the first and second groups, as relates to a selected axis of the beam, the beam paths lie in a plurality of planes.

46. A pulse stretcher for increasing the TIS of a narrow band output pulse of a laser output light pulse beam comprising:
a beam splitter in the path of the laser output light pulse beam, splitting the laser output light pulse beam into an output beam and a delayed beam;
an optical delay path receiving the delayed beam, the optical delay path comprising:
a first group of at least four mirrors, at least two of which are displaced out of the plane of the delayed beam as it is reflected from the beam splitter;
a second group of at least four mirrors, at least two of which are displaced out of the plane of the delayed beam as it is reflected from the beam splitter;
a first mounting plate containing the first group of mirrors arranged in a symmetrical pattern about a centerline axis of the first mounting plate; and,
a second mounting plate containing the first group of mirrors arranged in a symmetrical pattern about a centerline axis of the second mounting plate.

47. The apparatus of claim 46 further comprising:
the pulse stretcher is contained within an elongated housing.

48. The apparatus of claim 47 further comprising:
the elongated housing is cylindrical.

49. The apparatus of claim 46 further comprising:
the paths of the delayed beam within the optical delay path of the pulse stretcher are all out of the plane of the delayed bean as it is reflected by the beam splitter into the optical delay path with the exception of the delayed beam as it is reflected back to the beam splitter.

50. The apparatus of claim 47 further comprising:
the paths of the delayed beam within the optical delay path of the pulse stretcher are all out of the plane of the delayed bean as it is reflected by the beam splitter into the optical delay path with the exception of the delayed beam as it is reflected back to the beam splitter.

51. The apparatus of claim 48 further comprising:
the paths of the delayed beam within the optical delay path of the pulse stretcher are all out of the plane of the delayed bean as it is reflected by the beam splitter into the optical delay path with the exception of the delayed beam as it is reflected back to the beam splitter.

52. A method of delivering a laser output light pulse beam from a narrow band laser system output to the input of a micro-lithography tool, comprising:
providing a stretched laser light output pulse beam containing a plurality of pulses;
splitting the beam to pass a first percent of the energy of a first input pulse of the stretched laser output light pulse beam along a laser output light pulse beam output path as a first output pulse and to reflect a second percent of the energy of the first input pulse into a first delayed beam;
providing an optical delay path and delaying the first delayed beam and returning the first delayed beam to the beam splitter in an orientation such that a third percent of the first delayed beam is reflected into the output path as a second output pulse and a fourth percent is passed into the optical delay path as a second delayed beam;
receiving in the optical delay path the second delayed beam and returning the second delayed beam to the beam splitter in an orientation such that the third percent of the second delayed beam is reflected into the output path as a third output pulse and the fourth percent of the second delayed beam is passed into the optical delay path as a third delayed beam;
receiving in the optical delay path the third delayed beam and returning the third delayed beam to the beam splitter in an orientation such that the third percent of the third delayed beam is reflected into the output path as a fourth output pulse;

the first stretched input pulse being a first pulse in a plurality of pulses output from a prior pulse stretcher, each of a plurality of succeeding input pulses comprising the output of the prior pulse stretcher resulting from the stretching of a narrow band laser light output pulse, forming successive first, second, third and fourth output pulses, the combination of which forms a pulse stretcher having an output with a TIS of at least 200 ns.

* * * * *